United States Patent [19]
Estakhri et al.

[11] Patent Number: 5,838,614
[45] Date of Patent: Nov. 17, 1998

[54] IDENTIFICATION AND VERIFICATION OF A SECTOR WITHIN A BLOCK OF MASS STORAGE FLASH MEMORY

[75] Inventors: Petro Estakhri, Pleasanton; Berhau Iman, Sunnyvale, both of Calif.

[73] Assignee: Lexar Microsystems, Inc., Fremont, Calif.

[21] Appl. No.: 858,847

[22] Filed: May 19, 1997

Related U.S. Application Data

[63] Continuation-in-part of Ser. No. 831,266, Mar. 31, 1997, which is a continuation-in-part of Ser. No. 509,706, Jul. 31, 1995.

[51] Int. Cl.$^6$ .................................................. G11C 16/04
[52] U.S. Cl. ......................... 365/185.11; 365/185.22; 365/230.03; 395/430
[58] Field of Search .................... 365/185.11, 185.22, 365/230.03, 185.29; 395/425, 430

[56] References Cited

U.S. PATENT DOCUMENTS

| | | | |
|---|---|---|---|
| 4,405,952 | 9/1983 | Slakmon | 360/49 |
| 4,450,559 | 5/1984 | Bond et al. | 371/10 |
| 4,456,971 | 6/1984 | Fukuda et al. | 364/900 |
| 4,498,146 | 2/1985 | Martinez | 364/900 |
| 4,525,839 | 7/1985 | Nozawa et al. | 371/38 |
| 4,616,311 | 10/1986 | Sato | 364/200 |
| 4,654,847 | 3/1987 | Dutton | 371/10 |
| 4,710,871 | 12/1987 | Belknap et al. | 364/200 |
| 4,746,998 | 5/1988 | Robinson et al. | 360/72.1 |
| 4,748,320 | 5/1988 | Yorimoto et al. | 235/492 |
| 4,757,474 | 7/1988 | Fukushi et al. | 365/189 |
| 4,774,700 | 9/1988 | Satoh et al. | 369/54 |
| 4,800,520 | 1/1989 | Iijima | 364/900 |
| 4,896,262 | 1/1990 | Wayama et al. | 364/200 |
| 4,914,529 | 4/1990 | Bonke | 360/48 |

(List continued on next page.)

FOREIGN PATENT DOCUMENTS

| | | | |
|---|---|---|---|
| 0 557 723 | 1/1987 | Australia | G11C 5/00 |
| 0 220 718 A2 | 5/1987 | European Pat. Off. | G06F 15/40 |
| 0 243 503 A1 | 11/1987 | European Pat. Off. | G11B 20/10 |
| 0 424 191 A2 | 4/1991 | European Pat. Off. | G06F 11/00 |
| 0 489 204 A1 | 6/1992 | European Pat. Off. | G11B 16/06 |
| 0 522 780 A2 | 1/1993 | European Pat. Off. | G06F 3/06 |
| 0 544 252 A2 | 6/1993 | European Pat. Off. | G11C 16/06 |
| 0 686 976 A2 | 12/1995 | European Pat. Off. | G11C 16/06 |
| 93 01908 | 8/1993 | France | G06F 12/02 |
| 59-45695 A | 9/1982 | Japan | G11C 17/00 |

(List continued on next page.)

OTHER PUBLICATIONS

ISBN 0–07–031556–6, Book — *Computer Architecture and Parallel Processing*, Kai Hwang & Faye A. Briggs, McGraw–Hill Book Co., ©1984, p. 64.

1990 WL 2208325, Magazine — "State of the Art: Magnetic VS. Optical Store Data in a Flash", by Walter Lahti and Dean McCarron, Byte magazine dated Nov. 1, 1990, 311, vol. 15, No. 12.

(List continued on next page.)

*Primary Examiner*—Son T. Dinh
*Attorney, Agent, or Firm*—Claude A. S. Hamrick; Oppenheimer W. Donnelly; Maryam Imam

[57] ABSTRACT

A method and apparatus is disclosed for identifying a block being stored within flash memory devices using a cluster address for each block, the block being selectively erasable and having one or more sectors, the cluster address being stored in one of the sectors of the block. In an alternative embodiment, the cluster address is stored in at least two different sectors within the same block for ensuring that the information last written to the block is valid. Further disclosed is a novel way to use a defect flag for each block stored within the flash memory device for efficiently identifying non-defective blocks upon system power-up.

1 Claim, 21 Drawing Sheets

U.S. PATENT DOCUMENTS

| | | | |
|---|---|---|---|
| 4,920,518 | 4/1990 | Nakamura et al. | 365/228 |
| 4,924,331 | 5/1990 | Robinson et al. | 360/72.1 |
| 4,953,122 | 8/1990 | Williams | 364/900 |
| 5,070,474 | 12/1991 | Tuma et al. | 395/500 |
| 5,226,168 | 7/1993 | Kobayashi et al. | 395/800 |
| 5,270,979 | 12/1993 | Harari et al. | 365/218 |
| 5,297,148 | 3/1994 | Harari et al. | 371/10.2 |
| 5,303,198 | 4/1994 | Adachi et al. | 365/218 |
| 5,337,275 | 8/1994 | Garner | 365/189.01 |
| 5,341,330 | 8/1994 | Wells et al. | 365/185.11 |
| 5,341,339 | 8/1994 | Wells | 365/218 |
| 5,353,256 | 10/1994 | Fandrich et al. | 365/230.03 |
| 5,357,475 | 10/1994 | Hasbun et al. | 365/218 |
| 5,388,083 | 2/1995 | Assar et al. | 365/218 |
| 5,430,859 | 7/1995 | Norman et al. | 395/425 |
| 5,479,638 | 12/1995 | Assar et al. | 395/430 |
| 5,485,595 | 1/1996 | Assar et al. | 395/430 |
| 5,524,230 | 6/1996 | Sakaue et al. | 395/430 |
| 5,544,356 | 8/1996 | Robinson et al. | 395/600 |
| 5,566,314 | 10/1996 | DeMarco et al. | 395/430 |

FOREIGN PATENT DOCUMENTS

| | | | |
|---|---|---|---|
| 58-215794 A | 12/1983 | Japan | G11C 17/00 |
| 58-215795 A | 12/1983 | Japan | G11C 17/00 |
| 59-162695 A | 9/1984 | Japan | G11C 17/00 |
| 60-212900 | 2/1985 | Japan | G11C 29/00 |
| 61-96598 A | 5/1986 | Japan | G11C 17/00 |
| 62-283496 A | 12/1987 | Japan | G11C 17/00 |
| 62-283497 A | 12/1987 | Japan | G11C 17/00 |
| 63-183700 A | 7/1988 | Japan | G11C 17/00 |
| 4-332999 A | 11/1992 | Japan | G11C 29/00 |
| 84/00628 | 2/1984 | WIPO | G06F 11/20 |

OTHER PUBLICATIONS

G11C16/06 P4A1, Magazine — Technology Updates, Integrated Circuits, "1–Mbit flash memories seek their role in system design", Ron Wilson, Senior Editor, Computer Design magazine 28 (1989) Mar. 1, No.5, Tulsa OK, US, pp. 30 and 32.

Serial 9Mb F 1992 Symposium of VLSI Circuits Digest of Technical Papers, "EEPROM for Solid State Disk Applications", S. Mehoura et al., SunDisk Corporation, Santa Clara, CA. R. W. Gregor et al., AT&T Bell Laboratories, Allentown, PA. pp. 24 and 25.

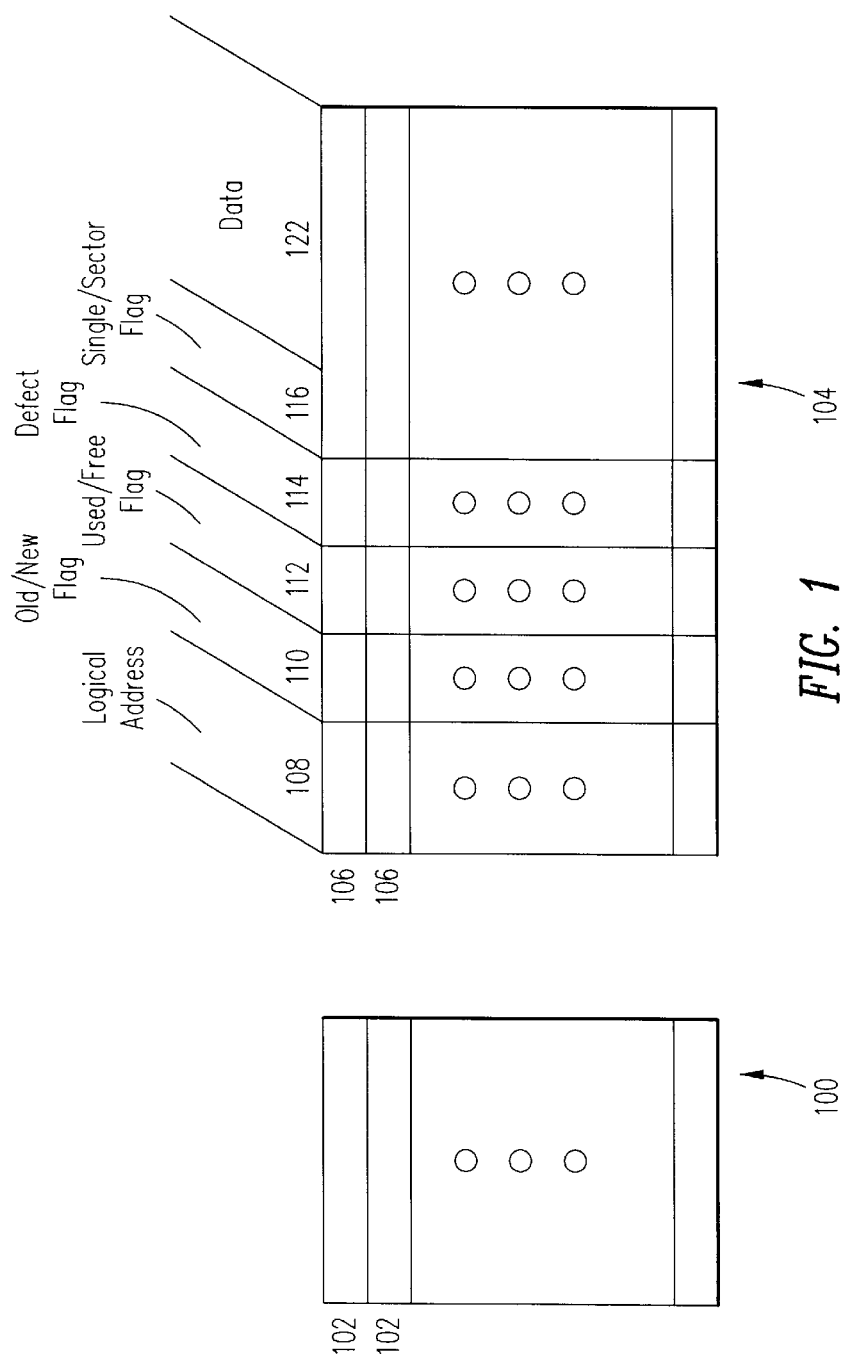
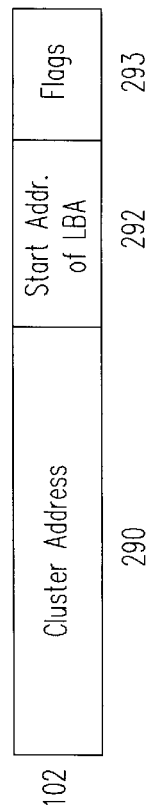
FIG. 1
FIG. 2

| Actual LBA/Actual PBA | Virtual PBA | old | used | def |
|---|---|---|---|---|
| 0 | | 0 | 0 | 0 |
| 1 | | 0 | 0 | 0 |
| 2 | | 0 | 0 | 0 |
| 3 | | 0 | 0 | 0 |
| 4 | | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

FIG. 4

| Actual LBA/Actual PBA | Virtual PBA | old | used | def |
|---|---|---|---|---|
| 0 | | 0 | 1 | 0 |
| 1 | | 0 | 0 | 0 |
| 2 | | 0 | 0 | 0 |
| 3 | 0 | 0 | 0 | 0 |
| 4 | | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

FIG. 5

| Actual LBA/Actual PBA | Virtual PBA | old | used | def |
|---|---|---|---|---|
| 0 | | 0 | 1 | 0 |
| 1 | | 0 | 1 | 0 |
| 2 | | 0 | 0 | 0 |
| 3 | 0 | 0 | 0 | 0 |
| 4 | 1 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

FIG. 6

| Actual LBA/ Actual PBA | Virtual PBA | old | used | def |
|---|---|---|---|---|
| 0 |  | 1 | 1 | 0 |
| 1 |  | 0 | 1 | 0 |
| 2 |  | 0 | 1 | 0 |
| 3 | 2 | 0 | 0 | 0 |
| 4 | 1 | 0 | 0 | 0 |
| 5 |  | 0 | 0 | 0 |
| 6 |  | 1 | 1 | 0 |
| 7 |  | 0 | 0 | 0 |
| 8 |  | 0 | 0 | 0 |
| 9 |  | 0 | 0 | 1 |
| 10 |  | 0 | 0 | 0 |

*FIG. 7*

| Actual LBA/ Actual PBA | Virtual PBA | old | used | def |
|---|---|---|---|---|
| 0 |  | 1 | 1 | 0 |
| 1 |  | 1 | 1 | 0 |
| 2 |  | 0 | 1 | 0 |
| 3 | 2 | 0 | 1 | 0 |
| 4 | 3 | 0 | 0 | 0 |
| 5 |  | 0 | 0 | 0 |
| 6 |  | 1 | 1 | 0 |
| 7 |  | 0 | 0 | 0 |
| 8 |  | 0 | 0 | 0 |
| 9 |  | 0 | 0 | 1 |
| 10 |  | 0 | 0 | 0 |

*FIG. 8*

| PBA/LBA | VPBA Blk Addr | MVPBA Blk Addr | Move Flag | Used Flag | Old Flag | Defect Flag | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 | 00 | XX | 0 | 1 | 0 | 0 | 0 | 0 | 0 | 0 | 0 | 0 | 0 | 0 | 0 | 0 | 0 | 0 | 0 | 0 | 0 | 0 |
| 10 | XX | XX | 0 | 0 | 0 | 0 | 0 | 0 | 0 | 0 | 0 | 0 | 0 | 0 | 0 | 0 | 0 | 0 | 0 | 0 | 0 | 0 |
| 20 | | | | | | | | | | | | | | | | | | | | | | |
| 30 | | | | | | | | | | | | | | | | | | | | | | |
| 40 | ... | ... | ... | ... | ... | ... | | | | | | | | | | | | | | | | |
| 50 | | | | | | | | | | | | | | | | | | | | | | |
| N−1 | | | | | | | | | | | | | | | | | | | | | | |

Host Write To LBA 0 Again

| PBA/LBA | VPBA Blk Addr | MVPBA Blk Addr | Move Flag | Used Flag | Old Flag | Defect Flag | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 | 00 | 20 | 1 | 1 | 0 | 0 | 1 | 0 | 0 | 0 | 0 | 0 | 0 | 0 | 0 | 0 | 0 | 0 | 0 | 0 | 0 | 0 |
| 10 | XX | XX | 0 | 1 | 1 | 0 | 0 | 0 | 0 | 0 | 0 | 0 | 0 | 0 | 0 | 0 | 0 | 0 | 0 | 0 | 0 | 0 |
| 20 | XX | XX | 0 | 1 | 0 | 0 | 0 | 0 | 0 | 0 | 0 | 0 | 0 | 0 | 0 | 0 | 0 | 0 | 0 | 0 | 0 | 0 |
| 30 | | | | | | ... | | | | | | | | | | | | | | | | | |
| 40 | | | | | | ... | | | | | | | | | | | | | | | | | |
| 50 | | | | | | ... | | | | | | | | | | | | | | | | | |
| ... | | | | | | | | | | | | | | | | | | | | | | | |
| N-1 | | | | | | | | | | | | | | | | | | | | | | | |

| PBA/LBA | VPBA Blk Addr 702/730 | MVPBA Blk Addr 704/732 | Move Flag 706/734 | Used Flag 708/736 | Old Flag 710/738 | Defect Flag 712/740 | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 — 716 | 00 | XX | 0 | 1 | 0 | 0 | 0 | 0 | 0 | 0 | 0 | 0 | 0 | 0 | 0 | 0 | 0 | 0 | 0 | 0 | 0 | 0 |
| 10 — 718 | XX | XX | 0 | 0 | 0 | 0 | 0 | 0 | 0 | 0 | 0 | 0 | 0 | 0 | 0 | 0 | 0 | 0 | 0 | 0 | 0 | 0 |
| 20 — 720 | | | | | | | | | | | | | | | | | | | | | | |
| 30 — 722 | | | | | | | | | | | | | | | | | | | | | | |
| 40 — 724 | | | | | | | | | | | | | | | | | | | | | | |
| 50 — 726 | | | | | | | | | | | | | | | | | | | | | | |
| ... | ... | ... | ... | ... | ... | ... | | | | | | | | | | | | | | | | |
| N−1 — 728 | | | | | | | | | | | | | | | | | | | | | | |

Host Write To LBA 0

700

Host Write To LBA 5

| PBA/LBA | VPBA Blk Addr (702/730) | MVPBA Blk Addr (732) | Move Flag (734) | Used Flag (742) | Old Flag (744) | Defect Flag (746) | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 (716) | 00 | 10 | 1 | 1 | 0 | 0 | 1 | 0 | 0 | 0 | 0 | 0 | 0 | 0 | 0 | 0 | 0 | 0 | 0 | 0 | 0 | 0 |
| 10 (718) | XX | XX | 0 | 1 | 0 | 0 | 0 | 0 | 0 | 0 | 0 | 1 | 0 | 0 | 0 | 0 | 0 | 0 | 0 | 0 | 0 | 0 |
| 20 (720) | | | | | | | 0 | 0 | 0 | 0 | 0 | 0 | 0 | 0 | 0 | 0 | 0 | 0 | 0 | 0 | 0 | 0 |
| 30 (722) | | | | | | | | | | | | | | | | | | | | | | |
| 40 (724) | | | | | | | | | | | | | | | | | | | | | | |
| 50 (726) | | | | | | | | | | | | | | | | | | | | | | |
| ... | ... | ... | ... | ... | ... | ... | | | | | | | | | | | | | | | | |
| N-1 (728) | | | | | | | | | | | | | | | | | | | | | | |

714 (L0–L15 columns)
700

Host Write To LBA 5

| PBA/LBA | VPBA Blk Addr | MVPBA Blk Addr | Move Flag | Used Flag | Old Flag | Defect Flag | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 | 00 | 20 | 1 | 1 | 0 | 0 | 1 | 0 | 0 | 0 | 0 | 1 | 0 | 0 | 0 | 0 | 0 | 0 | 0 | 0 | 0 | 0 |
| 10 | XX | XX | 0 | 1 | 1 | 0 | 0 | 0 | 0 | 0 | 0 | 0 | 0 | 0 | 0 | 0 | 0 | 0 | 0 | 0 | 0 | 0 |
| 20 | XX | XX | 0 | 1 | 0 | 0 | 0 | 0 | 0 | 0 | 0 | 0 | 0 | 0 | 0 | 0 | 0 | 0 | 0 | 0 | 0 | 0 |
| 30 | | | | | | ... | | | | | | | | | | | | | | | | | |
| 40 | | | | | | ... | | | | | | | | | | | | | | | | | |
| 50 | | | | | | ... | | | | | | | | | | | | | | | | | |
| N-1 | | | | | | | | | | | | | | | | | | | | | | | |

*FIG. 18*

Host Writes To LBA 7

| PBA/LBA | VPBA Blk Addr (702/730) | MVPBA Blk Addr (732) | Move Flag (734) | Used Flag (742/746) | Old Flag (744) | Defect Flag | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 (716) | 00 | 10 | 1 | 1 | 0 | 0 | 1 | 0 | 0 | 0 | 0 | 0 | 0 | 1 | 0 | 0 | 0 | 0 | 0 | 0 | 0 | 0 |
| 10 (718) | XX | XX | 0 | 1 | 0 | 0 | 0 | 0 | 0 | 0 | 0 | 1 | 0 | 0 | 0 | 0 | 0 | 0 | 0 | 0 | 0 | 0 |
| 20 (720) | | | | | | | 0 | 0 | 0 | 0 | 0 | 0 | 0 | 0 | 0 | 0 | 0 | 0 | 0 | 0 | 0 | 0 |
| 30 (722) | | | | | | | | | | | | | | | | | | | | | | |
| 40 (724) | | | | | | | | | | | | | | | | | | | | | | |
| 50 (726) | | | | | | | | | | | | | | | | | | | | | | |
| ... | | | | | | | | | | | | | | | | | | | | | | |
| N−1 (728) | | | | | | | | | | | | | | | | | | | | | | |

{714 brackets the L0–L15 columns}

| SPM ram Address | Virtual PBA (1036) | Flags (1038) | Defect Flag (1012) |
|---|---|---|---|
| 0 | 00 | | |
| 1 | 02 | | |
| 2 | 01 | | |
| 3 | | | |
| 4 | | | |
| ... | ... | ... | ... |
| | BLK ?? | | |

700 ↗

1040 — 1
1042 — 2
1044 — 3

1050 — LBA Z

PBA(BLK)     LBA
0     LBA = 0...15
1     LBA = 16..31
2     LBA = 32..47
3     LBA = 47..63
4

Key to FIG. 24

| FIG. 24a |
|---|
| FIG. 24b |

IDENTIFICATION AND VERIFICATION OF A SECTOR WITHIN A BLOCK OF MASS STORAGE FLASH MEMORY

CROSS REFERENCE TO RELATED APPLICATION

This application is a continuation-in-part of my prior application Ser. No. 08/831,266, filed Mar. 31, 1997, now pending entitled "MOVING SECTORS WITHIN A BLOCK OF INFORMATION IN A FLASH MEMORY MASS STORAGE ARCHITECTURE" which is a continuation-in-part of my another prior application Ser. No. 08/509,706, filed Jul. 31, 1995, entitled "DIRECT LOGICAL BLOCK ADDRESSING FLASH MEMORY MASS STORAGE ARCHITECTURE," now pending.

BACKGROUND OF THE INVENTION

1. Field of the Invention

This invention relates to the field of mass storage for computers. More particularly, this invention relates to an architecture for replacing a hard disk with a semiconductor nonvolatile memory and in particular flash memory.

2. Description of the Prior Art

Computers conventionally use rotating magnetic media for mass storage of documents, data, programs and information. Though widely used and commonly accepted, such hard disk drives suffer from a variety of deficiencies. Because of the rotation of the disk, there is an inherent latency in extracting information from a hard disk drive.

Other problems are especially dramatic in portable computers. In particular, hard disks are unable to withstand many of the kinds of physical shock that a portable computer will likely sustain. Further, the motor for rotating the disk consumes significant amounts of power decreasing the battery life for portable computers.

Solid state memory is an ideal choice for replacing a hard disk drive for mass storage because it can resolve the problems cited above. Potential solutions have been proposed for replacing a bard disk drive with a semiconductor memory. For such a system to be truly useful, the memory must be nonvolatile and alterable. The inventors have determined that FLASH memory is preferred for such a replacement.

FLASH memory is a transistor memory cell which is programmable through hot electron, source injection, or tunneling, and erasable through Fowler-Nordheim tunneling. The programming and erasing of such a memory cell requires current to pass through the dielectric surrounding floating gate electrode. Because of this, such types of memory have a finite number of erase-write cycles. Eventually, the dielectric deteriorates. Manufacturers of FLASH cell devices specify the limit for the number of erase-write cycles between 100,000 and 1,000,000.

One requirement for a semiconductor mass storage device to be successful is that its use in lieu of a rotating media hard disk mass storage device be transparent to the designer and the user of a system using such a device. In other words, the designer or user of a computer incorporating such a semiconductor mass storage device could simply remove the hard disk and replace it with a semiconductor mass storage device. All presently available commercial software should operate on a system employing such a semiconductor mass storage device without the necessity of any modification.

SanDisk proposed an architecture for a semiconductor mass storage using FLASH memory at the Silicon Valley PC Design Conference on Jul. 9, 1991. That mass storage system included read-write block sizes of 512 Bytes to conform with commercial hard disk sector sizes.

Earlier designs incorporated erase-before-write architectures. In this process, in order to update a file on the media, if the physical location on the media was previously programmed, it has to be erased before the new data can be reprogrammed.

This process would have a major deterioration on overall system throughput. When a host writes a new data file to the storage media, it provides a logical block address to the peripheral storage device associated with this data file. The storage device then translates this given logical block address to an actual physical block address on the media and performs the write operation. In magnetic hard disk drives, the new data can be written over the previous old data with no modification to the media. Therefore, once the physical block address is calculated from the given logical block address by the controller, it will simply write the data file into that location. In solid state storage, if the location associated with the calculated physical block address was previously programmed, before this block can be reprogrammed with the new data, it has to be erased. In one previous art, in erase-before-write architecture where the correlation between logical block address given by the host is one to one mapping with physical block address on the media. This method has many deficiencies. First, it introduces a delay in performance due to the erase operation before reprogramming the altered information. In solid state flash, erase is a very slow process.

Secondly, hard disk users typically store two types of information, one is rarely modified and another which is frequently changed. For example, a commercial spread sheet or word processing software program stored on a user's system are rarely, if ever, changed. However, the spread sheet data files or word processing documents are frequently changed. Thus, different sectors of a hard disk typically have dramatically different usage in terms of the number of times the information stored thereon is changed. While this disparity has no impact on a hard disk because of its insensitivity to data changes, in a FLASH memory device, this variance can cause sections of the mass storage to wear out and be unusable significantly sooner than other sections of the mass storage.

In another architecture, the inventors previously proposed a solution to store a table correlating the logical block address to the physical block address. The inventions relating to that solution are disclosed in U.S. patent application Ser. No. 08/038,668 filed on Mar. 26, 1993 and U.S. patent application Ser. No. 08/037,893 also filed on Mar. 26, 1993. Those applications are incorporated herein by reference.

The inventors' previous solution discloses two primary algorithms and an associated hardware architecture for a semiconductor mass storage device. It will be understood that "data file" in this patent document refers to any computer file including commercial software, a user program, word processing software document, spread sheet file and the like. The first algorithm in the previous solution provides means for avoiding an erase operation when writing a modified data file back onto the mass storage device. Instead, no erase is performed and the modified data file is written onto an empty portion of the mass storage.

The semiconductor mass storage architecture has blocks sized to conform with commercial hard disk sector sizes. The blocks are individually erasable. In one embodiment, the semiconductor mass storage can be substituted for a rotating hard disk with no impact to the user, so that such a substitution will be transparent. Means are provided for avoiding the erase-before-write cycle each time information stored in the mass storage is changed.

According to the first algorithm, erase cycles are avoided by programming an altered data file into an empty block. This would ordinarily not be possible when using conventional mass storage because the central processor and commercial software available in conventional computer systems are not configured to track continually changing physical locations of data files. The previous solution includes a programmable map to maintain a correlation between the logical address and the physical address of the updated information files.

All the flags, and the table correlating the logical block address to the physical block address are maintained within an array of CAM cells. The use of the CAM cells provides very rapid determination of the physical address desired within the mass storage, generally within one or two clock cycles. Unfortunately, as is well known, CAM cells require multiple transistors, typically six. Accordingly, an integrated circuit built for a particular size memory using CAM storage for the tables and flags will need to be significantly larger than a circuit using other means for just storing the memory.

The inventors proposed another solution to this problem which is disclosed in U.S. patent application Ser. No. 08/131,495 filed on Oct. 4, 1993. That application is incorporated herein by reference.

This additional previous solution invented by these same inventors is also for a nonvolatile memory storage device. The device is also configured to avoid having to perform an erase-before-write each time a data file is changed by keeping a correlation between logical block address and physical block address in a volatile space management RAM. Further, this invention avoids the overhead associated with CAM cell approaches which require additional circuitry.

Like the solutions disclosed above by these same inventors, the device includes circuitry for performing the two primary algorithms and an associated hardware architecture for a semiconductor mass storage device. In addition, the CAM cell is avoided in this previous solution by using RAM cells.

Reading is performed in this previous solutions by providing the logical block address to the memory storage. The system sequentially compares the stored logical block addresses until it finds a match. That data file is then coupled to the digital system. Accordingly, the performance offered by this solution suffers because potentially all of the memory locations must be searched and compared to the desired logical block address before the physical location of the desired information can be determined.

Additionally, a solution was disclosed in a U.S. patent application entitled "MOVING SECTORS WITHIN A BLOCK OF INFORMATION IN A FLASH MEMORY MASS STORAGE ARCHITECTURE", filed on Mar. 31, 1997 by Petro Estakhri, Berhanu Iman and Ali Ganjuei, to which this application is a continutaion-in-part. In the foregoing parent application, the disclosure of which is herein incorporated by reference, a method and apparatus was presented for efficiently moving sectors within a block from a first area within the nonvolatile memory to an unused area within the nonvolatile memory and marking the first area as "used".

What is however, needed in all of the above referenced solutions is to increase the efficiency of the system by quickly detecting defective blocks within the flash memory and to introduce various ways of identifying each block within the flash memory devices without foregoing memory capacity and performance.

SUMMARY OF THE INVENTION

The present invention is for a nonvolatile memory storage device. The device is configured to avoid having to perform an erase-before-write each time a data file is changed. Further, to avoid the overhead associated with CAM cells, this approach utilizes a RAM array. The host system maintains organization of the mass storage data by using a logical block address. The RAM array is arranged to be addressable by the same address as the logical block addresses (LBA) of the host. Each such addressable location in the RAM includes a field which holds the physical address of the data in the nonvolatile mass storage expected by the host. This physical block address (PBA) information must be shadowed in the nonvolatile memory to ensure that the device will still function after resuming operation after a power down because RAMs are volatile memory devices. In addition, status flags are also stored for each physical location. The status flags can be stored in either the nonvolatile media or in both the RAM and in the nonvolatile media.

The device includes circuitry for performing two primary algorithms and an associated hardware architecture for a semiconductor mass storage device. The first algorithm provides a means for mapping of host logical block address to physical block address with much improved performance and minimal hardware assists. In addition, the second algorithm provides means for avoiding an erase-before-write cycle when writing a modified data file back onto the mass storage device. Instead, no erase is performed and the modified data file is written onto an empty portion of the mass storage.

Reading is performed in the present invention by providing the logical block address to the memory storage. The RAM array is arranged so that the logical block address selects one RAM location. That location contains the physical block address of the data requested by the host or other external system. That data file is then read out to the host.

According to the second algorithm, erase cycles are avoided by programming an altered data file into an altered data mass storage block rather than itself after an erase cycle of the block as done on previous arts.

In an alternative embodiment of the present invention, a method and apparatus is presented for efficiently moving sectors within a block from a first area within the nonvolatile memory to an unused area within the nonvolatile memory and marking the first area as "used".

Briefly, A preferred embodiment of the present invention includes a method and apparatus for storing mapping information for mapping a logical block address identifying a block being accessed by a host to a physical block address, identifying a free area of nonvolatile memory, the block being selectively erasable and having one or more sectors that may be individually moved. The mapping information including a virtual physical block address for identifying an "original" location, within the nonvolatile memory, wherein a block is stored and a moved virtual physical block address for identifying a "moved" location, within the nonvolatile memory, wherein one or more sectors of the stored block are moved. The mapping information further including status information for use of the "original"physical block address and the "moved" physical block address and for providing information regarding "moved" sectors within the block being accessed.

IN THE DRAWINGS

FIG. 1 shows a schematic block diagram of an architecture for a semiconductor mass storage according to the present invention.

FIG. 2 shows an alternative embodiment to the physical block address 102 of the RAM storage of FIG. 1.

FIGS. 4 through 8 show the status of several of the flags and information for achieving the advantages of the present invention.

FIGS. 11–19 illustrate several examples of the state of a mapping table that may be stored in the digital system of FIG. 10 including LBA-PBA mapping information.

DETAILED DESCRIPTION OF THE PREFERRED EMBODIMENT

Figure 3:
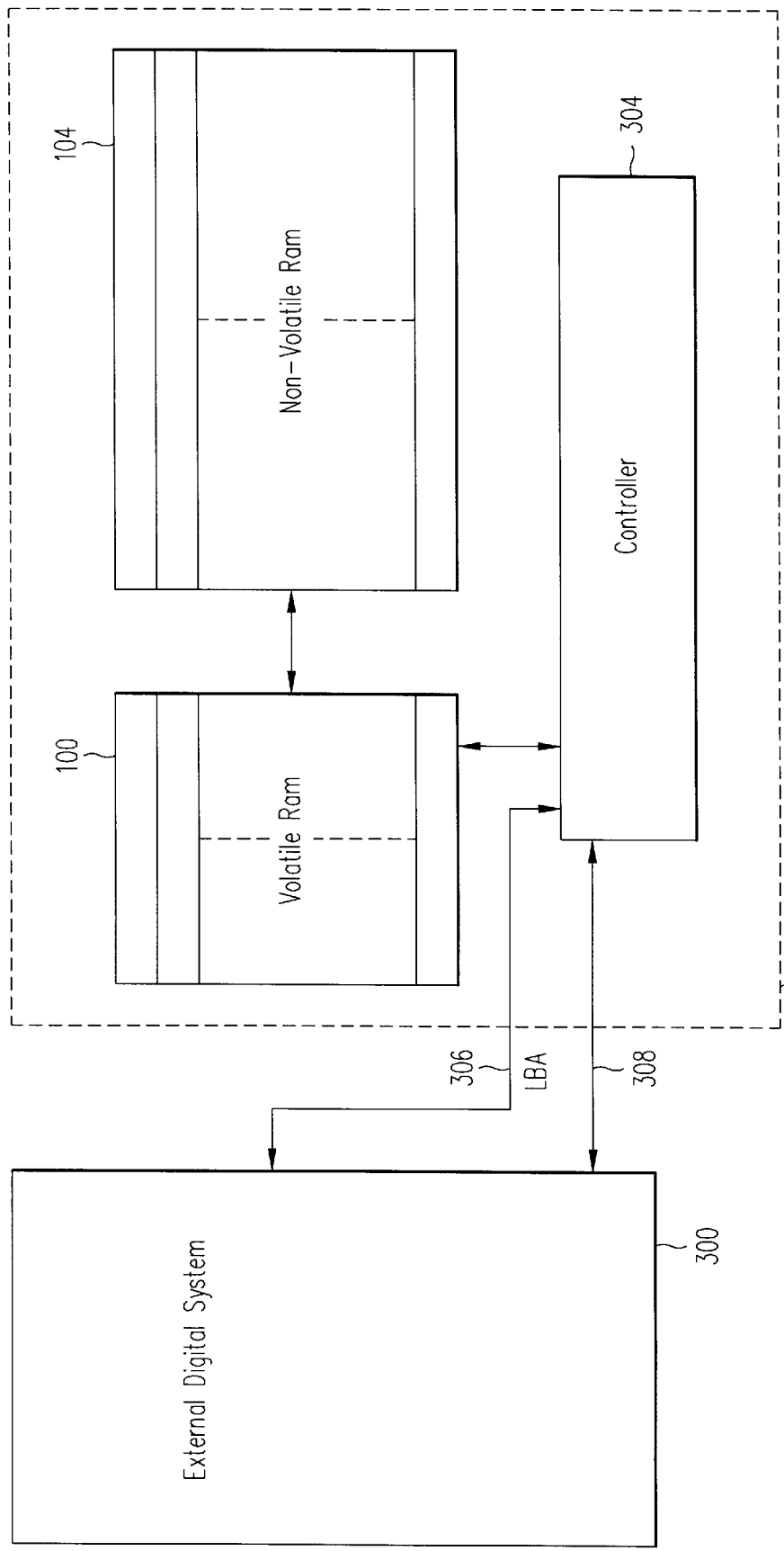
FIG. 3 shows a block diagram of a system incorporating the mass storage device of the present invention.

FIG. 1 shows an architecture for implementation of a solid state storage media according to the present invention. The storage media is for use with a host or other external digital system. The mass storage is partitioned into two portions, a volatile RAM array 100 and a nonvolatile array 104. According to the preferred embodiment, all of the nonvolatile memory storage is FLASH. The FLASH may be replaced by EEPROM. The RAM can be of any convenient type. The memory storage 104 is arranged into N blocks of data from zero through N−1. Each of the blocks of data is M Bytes long. In the preferred embodiment, each data block is 512 Bytes long to correspond with a sector length in a commercially available hard disk drive plus the extra numbers of bytes to store the flags and logical block address (LBA) information and the associated ECC. The memory 104 can contain as much memory storage as a user desires. An example of a mass storage device might include 100M Byte of addressable storage.

There are a plurality of RAM locations 102. Each RAM location 102 is uniquely addressable by controller using an appropriate one of the logical block addresses provided by the host system or the actual physical address of the nonvolatile media. The RAM location 102 contains the physical block address of the data associated with the logical block address and the flags associated with a physical block address on the nonvolatile media.

It is possible that the physical block address (PBA) can be split into two fields as shown in FIG. 2. These fields can be used for cluster addresses of a group of data blocks. The first such field 290 is used to select a cluster address and the second such field 292 can be used to select the start address of the logical block address associated with this cluster.

A collection of information flags is also stored for each nonvolatile memory location 106. These flags include an old/new flag 110, a used/free flag 112, a defect flag 114, and a single/sector flag 116. Additionally, there is also a data store 122.

When writing data to the mass storage device of the present invention, a controller determines the first available physical block for storing the data. The RAM location 102 corresponding to the logical block address selected by the host is written with the physical block address where the data is actually stored within the nonvolatile memory array in 104 (FIG. 1).

Assume for example that a user is preparing a word processing document and instructs the computer to save the document. The document will be stored in the mass storage system. The host system will assign it a logical block address. The mass storage system of the present invention will select a physical address of an unused block or blocks in the mass storage for storing the document. The address of the physical block address will be stored into the RAM location 102 corresponding to the logical block address. As the data is programmed, the system of the present invention also sets the used free flag 112 in 104 and 293 to indicate that this block location is used. One used/free flag 112 is provided for each entry of the nonvolatile array 104.

Later, assume the user retrieves the document, makes a change and again instructs the computer to store the document. To avoid an erase-before-write cycle, the system of the present invention provides means for locating a block having its used/free flag 112 in 100 unset (not programmed) which indicates that the associated block is erased. The system then sets the used/free flag for the new block 112 of 106 and 293 of 100 and then stores the modified document in that new physical block location 106 in the nonvolatile array 104. The address of the new physical block location is also stored into the RAM location 102 corresponding the logical block address, thereby writing over the previous physical block location in 102. Next, the system sets the old/new flag 110 of the previous version of the document indicating that this is an old unneeded version of the document in 110 of 104 and 293 of 109. In this way, the system of the present invention avoids the overhead of an erase cycle which is required in the erase-before-write of conventional systems to store a modified version of a previous document.

Because of RAM array 100 will lose its memory upon a power down condition, the logical block address with the active physical block address in the media is also stored as a shadow memory 108 in the nonvolatile array 104. It will be understood the shadow information will be stored into the appropriate RAM locations 102 by the controller. During power up sequence, the RAM locations in 100 are appropriately updated from every physical locations in 104, by reading the information 106 of 104. The logical address 108 of 106 is used to address the RAM location of 100 to update the actual physical block address associated with the given logical block address. Also since 106 is the actual physical block address associated with the new data 122, the flags 110, 112, 114, and 116 are updated in 293 of 102 with the physical block address of 106 in 100. It will be apparent to one of ordinary skill in the art that the flags can be stored in either the appropriate nonvolatile memory location 106 or in both the nonvolatile memory location and also in the RAM location 102 associated with the physical block address.

During power up, in order to assign the most recent physical block address assigned to a logical block address in the volatile memory 100, the controller will first read the Flags 110, 112, 114, and 116 portion of the nonvolatile memory 104 and updates the flags portion 293 in the volatile memory 100. Then it reads the logical block address 108 of every physical block address of the nonvolatile media 104 and by tracking the flags of the given physical block address in the volatile memory 100, and the read logical block address of the physical block address in the nonvolatile memory 104, it can update the most recent physical block address assigned to the read logical block address in the volatile memory 100.

FIG. 3 shows a block diagram of a system incorporating the mass storage device of the present invention. An external digital system 300 such as a host computer, personal computer and the like is coupled to the mass storage device 302 of the present invention. A logical block address is coupled via an address bus 306 to the volatile RAM array 100 and to a controller circuit 304. Control signals are also coupled to the controller 304 via a control bus 308. The volatile RAM array 1.00 is coupled for providing the physical block address to the nonvolatile RAM array 400. The controller 304 is coupled to control both the volatile RAM 100, the nonvolatile array 104, and for the generation of all flags.

A simplified example, showing the operation of the write operation according to the present invention is shown in FIGS. 4 through 8. Not all the information flags are shown to avoid obscuring these features of the invention in excessive detail. The data entries are shown using decimal numbers to further simplify the understanding of the invention. It will be apparent to one of ordinary skill in the art that in a preferred embodiment binary counting will be used.

FIG. 4 shows an eleven entry mass storage device according to the present invention. There is no valid nor usable data stored in the mass storage device of FIG. 4. Accordingly, all the physical block addresses are empty. The data stored in the nonvolatile mass storage location '6' is filled and old. Additionally, location '9' is defective and cannot be used.

The host directs the mass storage device of the example to write data pursuant to the logical block address '3' and then to '4'. The mass storage device will first write the data associated with the logical block address '3'. The device determines which is the first unused location in the nonvolatile memory. In this example, the first empty location is location '0'. Accordingly, FIG. 5 shows that for the logical block address '3', the corresponding physical block address '0' is stored and the used flag is set in physical block address '0'. The next empty location is location '1'. FIG. 6 shows that for the logical block address '4', the corresponding physical block address '1' is stored and the used flag is set in physical block address '1'.

The host instructs that something is to be written to logical block address '3' again. The next empty location is determined to be location '2'. FIG. 7 shows that the old flag in location '0' is set to indicate that this data is no longer usable, the used flag is set in location '2' and the physical block address in location '3' is changed to '2'.

Next, the host instructs that something is to be written to logical block address '4' again. The next empty location is determined to be location '3'. FIG. 8 shows that the old flag in location '1' is set to indicate that this data is no longer usable, the used flag is set in location '3' and the physical block address in location '4' is changed to '3'. (Recall that there is generally no relation between the physical block address and the data stored in the same location.)

Figure 9:
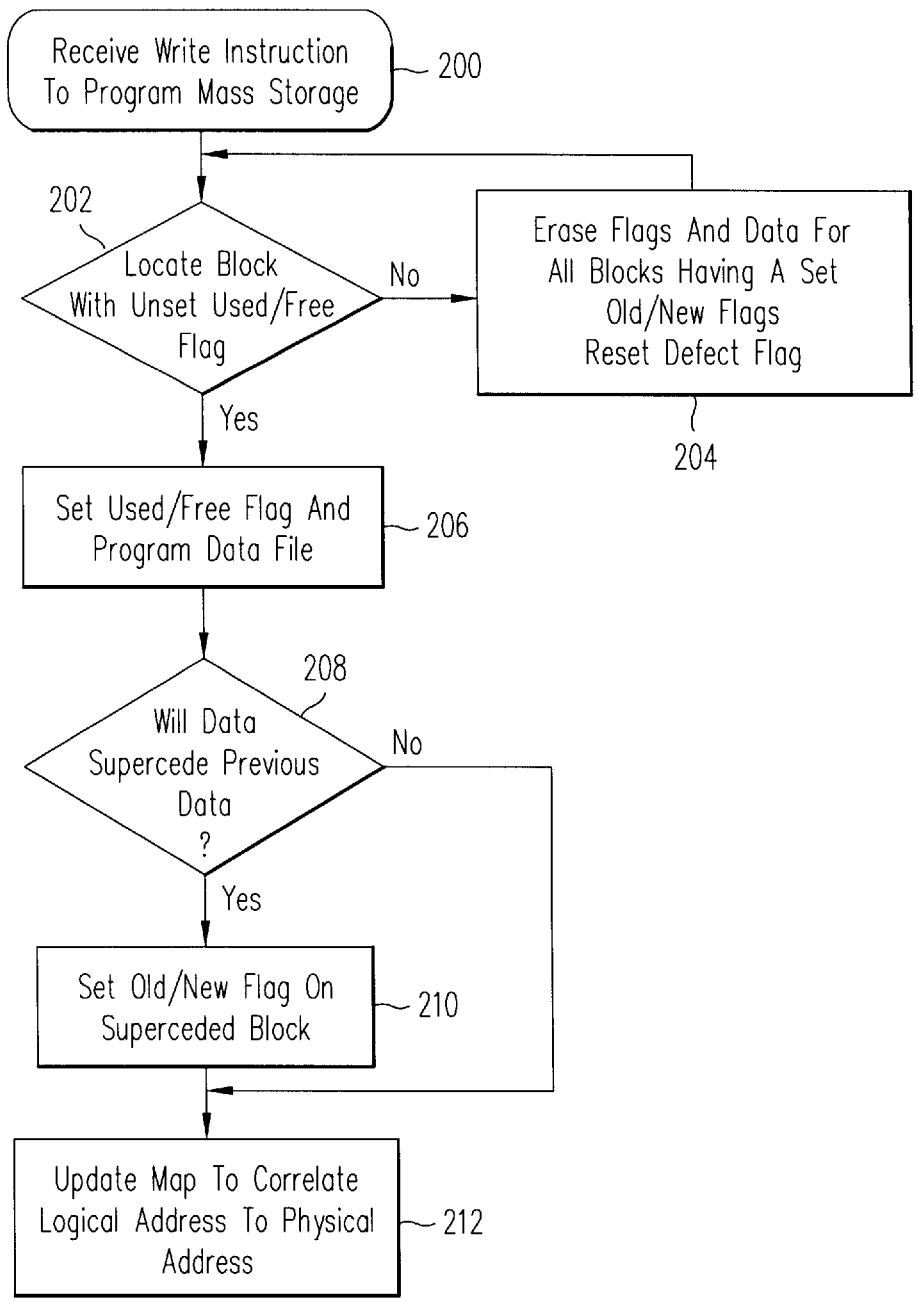
FIG. 9 shows a flow chart block diagram of the first algorithm according to the present invention.

FIG. 9 shows algorithm 1 according to the present invention. When the system of the present invention receives an instruction to program data into the mass storage (step 200), then the system attempts to locate a free block (step 202), i.e., a block having an unset (not programmed) used/free flag. If successful, the system sets the used/free flag for that block and programs the data into that block (step 206).

If on the other hand, the system is unable to locate a block having an unset used/free flag, the system erases the flags (used/free and old/new) and data for all blocks having a set old/new flag and unset defect flag (step 204) and then searches for a block having an unset used/free flag (step 202). Such a block has just been formed by step 204. The system then sets the used/flag for that block and programs the data file into that block (step 206).

If the data is a modified version of a previously existing file, the system must prevent the superseded version from being accessed. The system determines whether the data file supersedes a previous data file (step 208). If so, the system sets the old/new flag associated with the superseded block (step 210). If on the other hand, the data file to be stored is a newly created data file, the step of setting the old/new flag (step 210) is skipped because there is no superseded block. Lastly, the map for correlating the logical address 308- to the physical addresses updated (step 212).

By following the procedure outlined above, the overhead associated with an erase cycle is avoided for each write to the memory 104 except for periodically. This vastly improves the performance of the overall computer system employing the architecture of the present invention.

In the preferred embodiment of the present invention, the programming of the flash memory follows the procedure commonly understood by those of ordinary skill in the art. In other words, the program impulses are appropriately applied to the bits to be programmed and then compared to the data being programmed to ensure that proper programming has occurred. In the event that a bit fails to be erased or programmed properly, a defect flag 148 is set which prevent that block from being used again.

Figure 10:
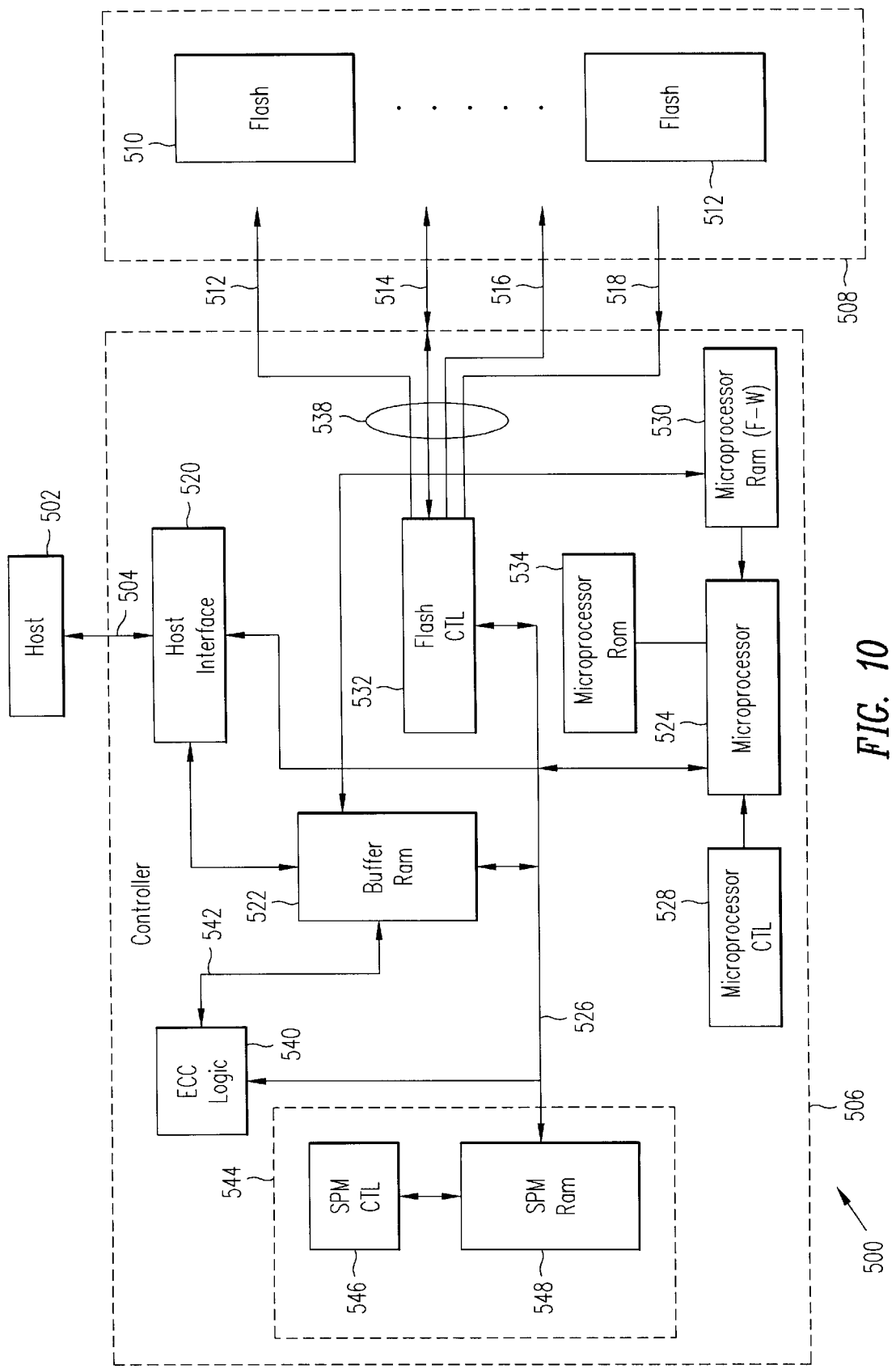
FIG. 10 shows a high-level block diagram of a digital system, such as a digital camera, including a preferred embodiment of the present invention.

FIG. 10 depicts a digital system 500 such as a digital camera employing an alternative embodiment of the present invention. Digital system 500 is illustrated to include a host 502, which may be a personal computer (PC) or simply a processor of any generic type commonly employed in digital systems, coupled to a controller circuit 506 for storing in and retrieving information from non-volatile memory unit 508.

The controller circuit 506 may be a semiconductor (otherwise referred to as an "integrated circuit" or "chip") or optionally a combination of various electronic components. In the preferred embodiment, the controller circuit is depicted as a single chip device. The non-volatile memory unit 508 is comprised of one or more memory devices, which may each be flash or EEPROM types of memory. In the preferred embodiment of FIG. 10, memory unit 508 includes a plurality of flash memory devices, 510–512, each flash device includes individually addressable locations for storing information. In the preferred application of the embodiment in FIG. 10, such information is organized in blocks with each block having one or more sectors of data. In addition to the data, the information being stored may further include status information regarding the data blocks, such as flag fields, address information and the like.

The host 502 is coupled through host information signals 504 to a controller circuit 506. The host information signals comprise of address and data busses and control signals for communicating command, data and other types of information to the controller circuit 506, which in turn stores such information in memory unit 508 through flash address bus 512, flash data bus 514, flash signals 516 and flash status signals 518 (508 and 512–516 collectively referred to as signals 538). The signals 538 may provide command, data and status information between the controller 506 and the memory unit 508.

The controller 506 is shown to include high-level functional blocks such as a host interface block 520, a buffer RAM block 522, a flash controller block 532, a microprocessor block 524, a microprocessor controller block 528, a microprocessor storage block 530, a microprocessor ROM block 534, an ECC logic block 540 and a space manager block 544. The host interface block 520 receives host information signals 504 for providing data and status information from buffer RAM block 522 and microprocessor block 524 to the host 502 through host information signals 504. The host interface block 520 is coupled to the microprocessor block 524 through the microprocessor information signals 526, which is comprised of an address bus, a data bus and control signals.

The microprocessor block 524 is shown coupled to a microprocessor controller block 528, a microprocessor storage block 530 and a microprocessor ROM block 534, and serves to direct operations of the various functional blocks shown in FIG. 10 within the controller 506 by executing program instructions stored in the microprocessor storage block 530 and the microprocessor ROM block 534. Microprocessor 524 may, at times, execute program instructions (or code) from microprocessor ROM block 534, which is a non-volatile storage area. On the other hand, microprocessor storage block 530 may be either volatile, i.e., read-and-write memory (RAM), or non-volatile, i.e., EEPROM, type of memory storage. The instructions executed by the microprocessor block 524, collectively referred to as program code, are stored in the storage block 530 at some time prior to the beginning of the operation of the system of the present invention. Initially, and prior to the execution of program code from the microprocessor storage location 530, the program code may be stored in the memory unit 508 and later downloaded to the storage block 530 through the signals 538. During this initialization, the microprocessor block 524 can execute instructions from the ROM block 534.

Controller 506 further includes a flash controller block 532 coupled to the microprocessor block 524 through the microprocessor information signals 526 for providing and receiving information from and to the memory unit under the direction of the microprocessor. Information such as data may be provided from flash controller block 532 to the buffer RAM block 522 for storage (may be only temporary storage) therein through the microprocessor signals 526. Similarly, through the microprocessor signals 526, data may be retrieved from the buffer RAM block 522 by the flash controller block 532.

ECC logic block 540 is coupled to buffer RAM block 522 through signals 542 and further coupled to the microprocessor block 524 through microprocessor signals 526. ECC logic block 540 includes circuitry for generally performing error coding and correction functions. It should be understood by those skilled in the art that various ECC apparatus and algorithms are commercially available and may be employed to perform the functions required of ECC logic block 540. Briefly, these functions include appending code that is for all intensive purposes uniquely generated from a polynomial to the data being transmitted and when data is received, using the same polynomial to generate another code from the received data for detecting and potentially correcting a predetermined number of errors that may have corrupted the data. ECC logic block 540 performs error detection and/or correction operations on data stored in the memory unit 508 or data received from the host 502.

The space manager block 544 employs a preferred apparatus and algorithm for finding the next unused (or free) storage block within one of the flash memory devices for storing a block of information, as will be further explained herein with reference to other figures. As earlier discussed, the address of a block within one of the flash memory devices is referred to as PBA, which is determined by the space manager by performing a translation on an LBA received from the host. A variety of apparatus and method may be employed for accomplishing this translation. An example of such a scheme is disclosed in U.S. Pat. No. 5,485,595, entitled "Flash Memory Mass Storage Architecture Incorporating Wear Leveling Technique Without Using CAM Cells", the specification of which is herein incorporated by reference. Other LBA to PBA translation methods and apparatus may be likewise employed without departing from the scope and spirit of the present invention.

Space manager block 544 includes SPM RAM block 548 and SPM control block 546, the latter two blocks being coupled together. The SPM RAM block 548 stores the LBA-PBA mapping information (otherwise herein referred to as translation table, mapping table, mapping information, or table) under the control of SPM control block 546. Alternatively, the SPM RAM block 548 may be located outside of the controller, such as shown in FIG. 3 with respect to RAM array 100.

In operation, the host 502 writes and reads information from and to the memory unit 508 during for example, the performance of a read or write operation through the controller 506. In so doing, the host 502 provides an LBA to the controller 506 through the host signals 504. The LBA is received by the host interface block 520. Under the direction of the microprocessor block 524, the LBA is ultimately provided to the space manager block 544 for translation to a PBA and storage thereof, as will be discussed in further detail later.

Under the direction of the microprocessor block 524, data and other information are written into or read from a storage area, identified by the PBA, within one of the flash memory devices 510–512 through the flash controller block 532. The information stored within the flash memory devices may not be overwritten with new information without first being erased, as earlier discussed. On the other hand, erasure of a block of information (every time prior to being written), is a very time and power consuming measure. This is sometimes referred to as erase-before-write operation. The preferred embodiment avoids such an operation by continuously, yet efficiently, moving a sector (or multiple sectors) of information, within a block, that is being re-written from a PBA location within the flash memory to an unused PBA location within the memory unit 508 thereby avoiding frequent erasure operations. A block of information may be comprised of more than one sector such as 16 or 32 sectors. A block of information is further defined to be an individually-erasable unit of information. In the past, prior art systems have moved a block stored within flash memory devices that has been previously written into a free (or unused) location within the flash memory devices. Such systems however, moved an entire block even when only one sector of information within that block was being re-written. In other words, there is waste of both storage capacity within the flash memory as well as waste of time in moving an entire block's contents when less than the total number of sectors within the block are being re-written. The preferred embodiments of the present invention, as discussed herein, allow for "moves" of less than a block of information thereby decreasing the number of move operations of previously-written sectors, consequently, decreasing the number of erase operations.

Referring back to FIG. 10, it is important to note that the SPM RAM block 548 maintains a table that may be modified each time a write operation occurs thereby maintaining the LBA-PBA mapping information and other information regarding each block being stored in memory unit 508. Additionally, this mapping information provides the actual location of a sector (within a block) of information within the flash memory devices. As will be further apparent, at least a portion of the information in the mapping table stored in the SPM RAM block 548 is "shadowed" (or copied) to memory unit 508 in order to avoid loss of the mapping information when power to the system is interrupted or terminated. This is, in large part, due to the use of volatile memory for maintaining the mapping information. In this connection, when power to the system is restored, the portion of the mapping information stored in the memory unit 508 is transferred to the SPM RAM block 548.

It should be noted, that the SPM RAM block 548 may alternatively be nonvolatile memory, such as in the form of flash or EEPROM memory architecture. In this case, the mapping table will be stored within nonvolatile memory thereby avoiding the need for "shadowing" because during power interruptions, the mapping information stored in nonvolatile memory will be clearly maintained.

When one or more sectors are being moved from one area of the flash memory to another area, the preferred embodiment of the present invention first moves the sector(s) from the location where they are stored in the flash memory devices, i.e., 510–512, to the buffer RAM block 522 for temporary storage therein. The moved sector(s) are then moved from the buffer RAM block 522 to a free area within one of the flash memory devices. It is further useful to note that the ECC code generated by the ECC logic block 540, as discussed above, is also stored within the flash memory devices 510–512 along with the data, as is other information, such as the LBA corresponding to the data and flag fields.

FIGS. 11–19 are presented to show examples of the state of a table 700 in SPM RAM block 548 configured to store LBA-PBA mapping information for identification and location of blocks (and sectors within the blocks) within the memory unit 508. Table 700 in all of these figures is shown to include an array of columns and rows with the columns including virtual physical block address locations or VPBA block address locations 702, move virtual physical address locations or MVPBA block address locations 704, move flag locations 706, used/free flag locations 708, old/new flag locations 710, defect flag locations 712 and sector move status locations 714.

The rows of table include PBA/LBA rows 716, 718 through 728 with each row having a row number that may be either an LBA or a PBA depending upon the information that is being addressed within the table 700. For example, row 716 is shown as being assigned row number '00' and if PBA information in association with LBA '00' is being retrieved from table 700, then LBA '00' may be addressed in SPM RAM block 548 at row 716 to obtain the associated PBA located in 730. On the other hand, if status information, such as flag fields, 706–712, regarding a block is being accessed, the row numbers of rows 716–728, such as '00', '10', '20', '30', '40', '50', 'N–1' represent PBA, as opposed to LBA, values. Furthermore, each row of table 700 may be thought of as a block entry wherein each entry contains information regarding a block. Furthermore, each row of table 700 may be addressed by an LBA.

In the preferred embodiment, each block is shown to include 16 sectors. This is due to the capability of selectively erasing an entire block of 16 sectors (which is why the block size is sometimes referred to as an "erase block size". If an erase block size is 16 sectors, such as shown in FIGS. 11–19, each block entry (or row) includes information regarding 16 sectors. Row 716 therefore includes information regarding a block addressed by LBA '00' through LBA '15' (or LBA '00' through LBA '0F' in Hex. notation). The next row, row 718, includes information regarding blocks addressed by LBA '16' (or '10' in Hex.) through LBA '31' (or '1F' in Hex.) The same is true for PBAs of each block.

It should be noted however, other block sizes may be similarly employed. For example, a block may include 32 sectors and therefore an erase block size 32. In the latter situation, each block entry or row, such as 716, 718, 720 . . . ., would include information regarding 32 sectors. where each block comprises of 16 sectors (other than 16-sector block sizes may be similarly employed).

The VPBA block address locations 702 of table 700 stores information generally representing a PBA value corresponding to a particular LBA value. The MVPBA block address locations 704 store information representing a PBA value identifying, within the memory unit 508, the location of where a block (or sector portions thereof) may have been moved. The move flag locations 706 store values indicating whether the block being accessed has any sectors that may have been moved to a location whose PBA is indicated by the value in the MVPBA block address location 704 (the PBA value within 704 being other than the value indicated in VPBA block address 702 wherein the remaining block address information may be located). The used/new flag location 708 stores information to indicate whether the block being accessed is a free block, that is, no data has been stored since the block was last erased. The old/new flag location 710 stores information representing the status of the block being accessed as to whether the block has been used and re-used and therefore, old. The defect flag location 712 stores information regarding whether the block is defective. If a block is declared defective, as indicated by the value in the defect flag location 712 being set, the defective block can no longer be used. Flags 708–712 are similar to the flags 110–114 shown and described with respect to FIG. 1.

Sector move status location 714 is comprised of 16 bits (location 714 includes a bit for each sector within a block so for different-sized blocks, different number of bits within location 714 are required) with each bit representing the status of a sector within the block as to whether the sector has been moved to another block within the memory unit 508. The moved block location within the memory unit 508 would be identified by a PBA that is other than the PBA value in VPBA block address location 702. Said differently, the status of whether a sector within a block has been moved, as indicated by each of the bits within 714, suggests which one of either the VPBA block address locations 702 or the MBPBA block address locations 704 maintain the most recent PBA location for that sector.

Referring still to FIG. 11, an example of the status of the table 700 stored in SPM RAM block 548 (in FIG. 10) is shown when, by way of example, LBA '0' is being written. As previously noted, in the figures presented herein, a block size of sixteen sectors (number 0–15 in decimal notation or 0–10 in hexadecimal notation) is used to illustrate examples only. Similarly, N blocks (therefore N LBAs) are employed, numbered from 0–N–1. The block size and the number of blocks are both design choices that may vary for different applications and may depend upon the memory capacity of each individual flash memory device (such as 510–512) being employed. Furthermore, a preferred sector size of 512 bytes is used in these examples whereas other sector sizes may be employed without departing from the scope and spirit of the present invention.

Assuming that the operation of writing to LBA '0' is occurring after initialization or system power-up when all of the blocks within the flash memory devices 510–512 (in FIG. 10) have been erased and are thus free. The space manager block 548 is likely to determine that the next free PBA location is '00'. Therefore, '00' is written to 730 in VPBA block address 702 of row 716 wherein information regarding LBA '0' is maintained, as indicated in table 700 by LBA row number '00'. Since no need exists for moving any of the sectors within the LBA 0 block, the MVPBA block address 704 for row 716, which is shown as location 732 may include any value, such as an initialization value (in FIG. 11, 'XX' is shown to indicate a "don't care" state).

The value in 734 is at logic state '0' to show that LBA '0' block does not contain any moved sectors. Location 736 within the used flag 708 column of row 716 will be set to logic state '1' indicating that the PBA '0' block is in use. The state of location 738, representing the old flag 710 for row 716, is set to '0' to indicate that PBA '0' block is not "old" yet. Location 740 maintains logic state '0' indicating that the PBA '0' block is not defective and all of the bits in move status location 714 are at logic state '0' to indicate that none of the sectors within the LBA '0' through LBA '15' block have been moved.

In FIG. 11, the status information for LBA '0' in row 716, such as in move flag location 706, used flag location 708, old flag location 710, defect flag location 712 and move status location 714 for all remaining rows, 716–728, of table 700 are at logic state '0'. It is understood that upon power-up of the system and/or after erasure of any of the blocks, the entries for the erased blocks, which would be all blocks upon power-up, in table 700, are all set to logic state '0'.

At this time, a discussion of the contents of one of the flash memory devices within the memory unit 508, wherein the LBA '0' block may be located is presented for the purpose of a better understanding of the mapping information shown in table 700 of FIG. 11.

Figure 20:
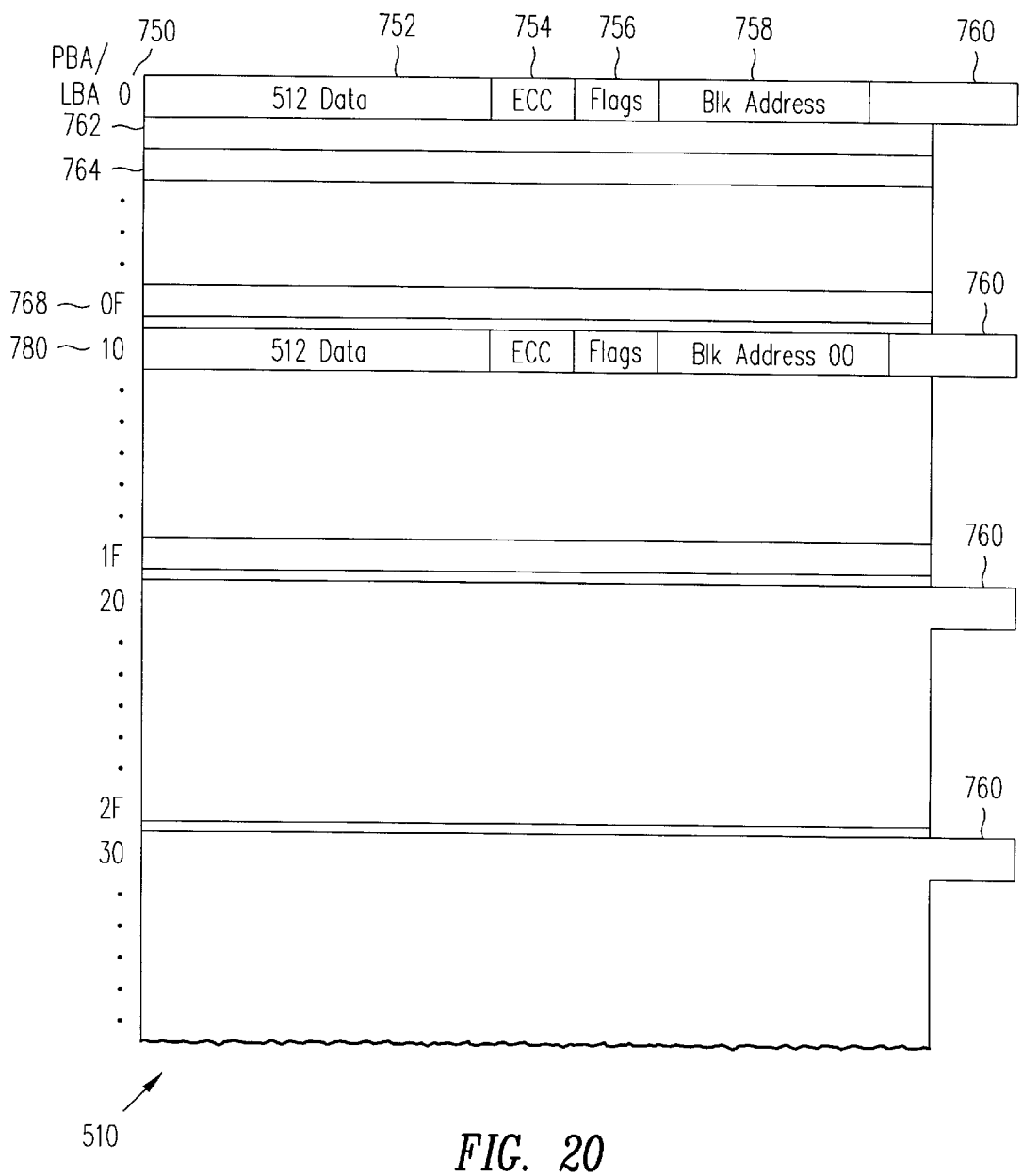
FIG. 20 depicts an example of a nonvolatile memory device employed in the preferred embodiment of FIG. 10.
Figure 22:
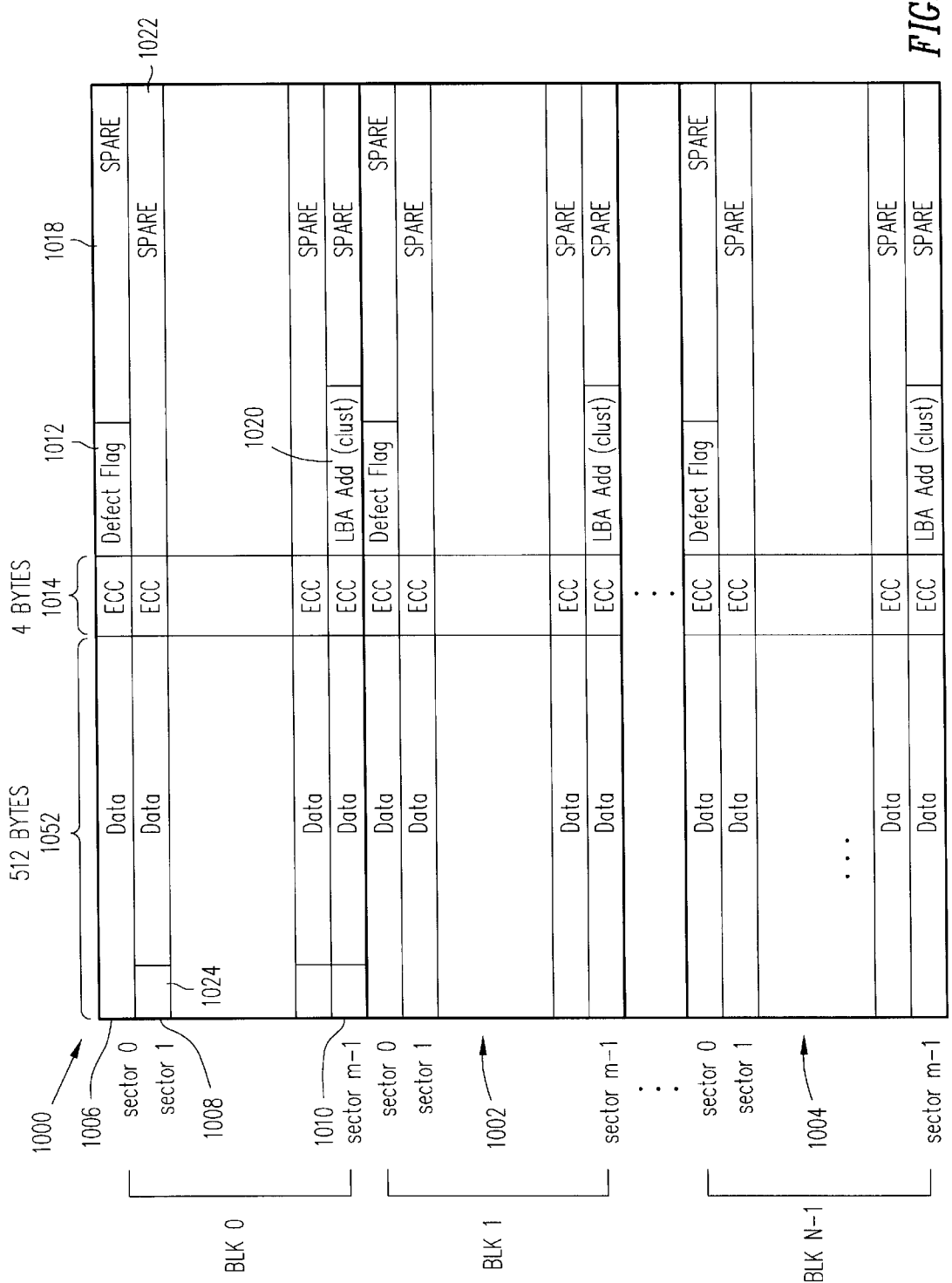
FIG. 22 shows an example of the contents of flash memory devices in an alternative embodiment of the present invention using a novel defect flag and LBA address means.

Turning now to FIG. 20, an example is illustrated of the contents of the flash memory device 510 in accordance with the state of table 700 (as shown in FIG. 11). LBA '0', which within the memory unit 508 is identified at PBA '0' by controller 506 (of FIG. 10) is the location wherein the host-identified block is written. A PBA0 row 750 is shown in FIG. 22 to include data in sector data location 752. An ECC code is further stored in ECC location 754 of PBA0 row 750. This ECC code is generated by the ECC logic block 540 in association with the data being written, as previously discussed. Flag field 756 in PBA0 row 750 contains the move, used, old and defect flag information corresponding to the sector data of the block being written. In this example, in flag field 756, the "used" flag and no other flag is set, thus, flag field 756 maintains a logic state of '0100' indicating that PBA '0' is "used" but not "moved", "old" or "defective".

PBA0 row 750 additionally includes storage location for maintaining in LBA address location 758, the LBA number corresponding to PBA '0', which in this example, is '0'. While not related to the example at hand, the remaining PBA locations of LBA '0' are stored in the next 15 rows following row 750 in the flash memory device 510.

It will be understood from the discussion of the examples provided herein that the information within a PBA row of flash memory device 510 is enough to identify the data and status information relating thereto within the LBA '0' block including any moves associated therewith, particularly due to the presence of the "move" flag within each PBA row (750, 762, 764, § of the flash memory. Nevertheless, alternatively, another field may be added to the first PBA row of each LBA location within the flash, replicating the status of the bits in the move status location 714 of the corresponding row in table 700. This field is optionally stored in sector status location 760 shown in FIG. 20 to be included in the first PBA row of each LBA block, such as row 750, 780 and so on. Although the information maintained in location 760 may be found by checking the status of the "move" flags within the flag fields 756 of each PBA row, an apparent advantage of using location 760 is that upon start-up (or power-on) of the system, the contents of table 700 in SPM RAM block 548 may be updated more rapidly due to fewer read operations (the reader is reminded that table 700 is maintained in SPM RAM 548, which is volatile memory whose contents are lost when the system is power-down and needs to be updated upon power-up from non-volatile memory, i.e. memory unit 508).

That is, rather than reading every PBA row (altogether 16 rows in the preferred example) to update each LBA entry of the table 700 upon power-up, only the first PBA row of each LBA must be read from flash memory and stored in SPM RAM 548 thereby saving time by avoiding needless read operations. On the other hand, clearly more memory capacity is utilized to maintain 16 bits of sector status information per LBA.

In the above example, wherein location 760 is used, the value in sector status location 760 would be all '0''s (or '0000' in hexadecimal notation).

In flash memory device 510, each of the rows 750, 762, 764, 768 . . ., is a PBA location with each row having a PBA row number and for storing data and other information (data and other information are as discussed above with respect to row 750) for a sector within a block addressed by a particular LBA. Furthermore, every sixteen sequential PBA rows represents one block of information. That is, PBA rows 750, 762, 764 through 768, which are intended to show 16 PBA rows correspond to LBA 0 (shown as row 716 in table 700 of FIG. 11) and each of the PBA rows maintains information regarding a sector within the block. The next block of information is for the block addressed by LBA '10' (in Hex.) whose mapping information is included in row 718 of table 700, and which is stored in locations starting from '10' (in hexadecimal notation, or '16' in decimal notation) and ending at '1F' (in hexadecimal notation, or '31') in the flash memory device 510 and so on.

Figure 12:
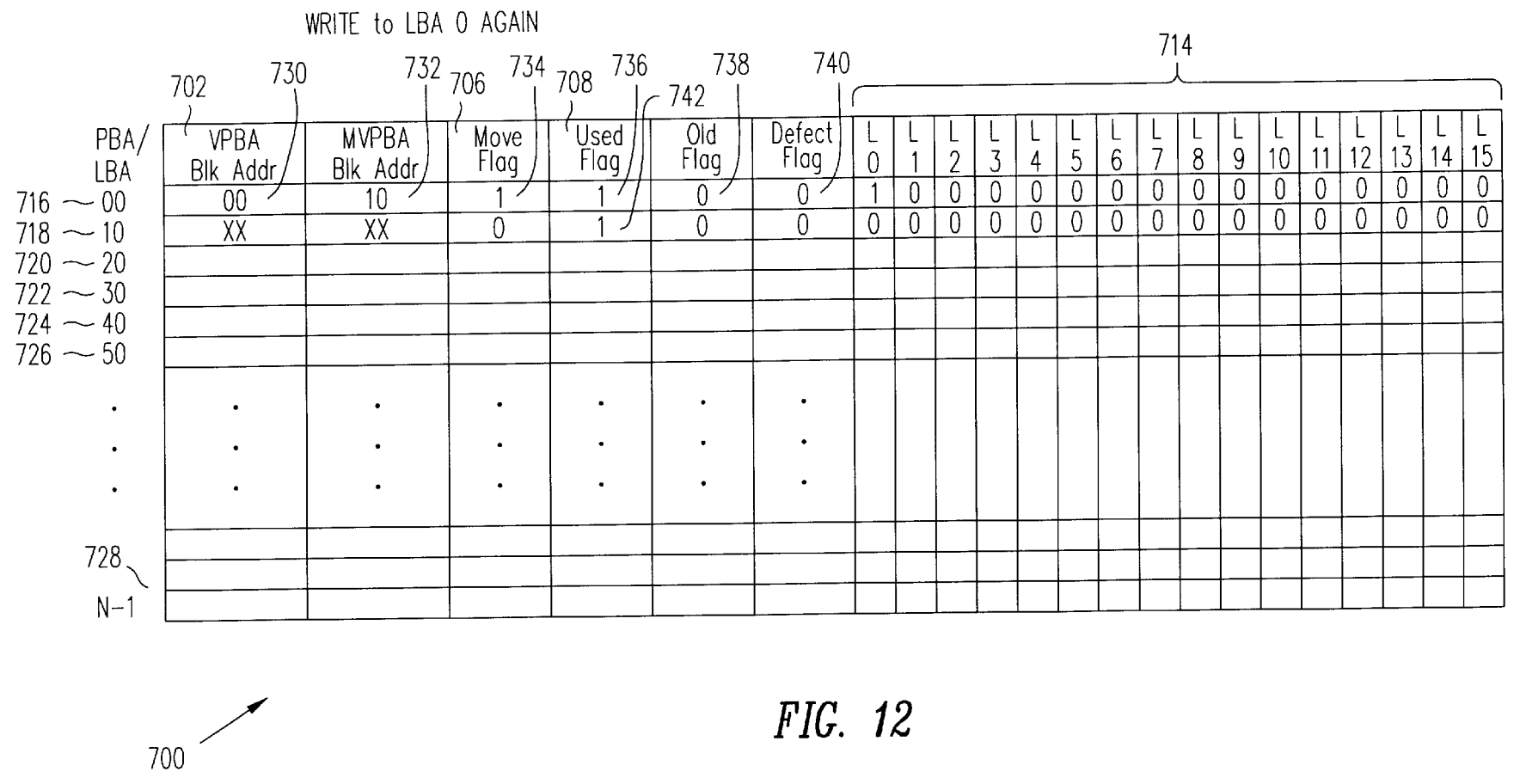

Continuing on with the above example, FIG. 12 shows an example of the state of table 700 when LBA 0 is again being written by the host. Since LBA 0 has already been written and is again being written without first being erased, another free location within the memory unit 508 (it may serve helpful to note here that the blocks, including their sectors, are organized sequentially and continuously through each of the flash memory devices of memory unit 508 according to their PBAs such that for example, the next flash memory device following device 510 picks up the PBA-addressed blocks where flash memory device 510 left off, an example of this is where flash memory device 510 includes PBAs of 0-FF (in Hex.) and the next flash memory device, which may be 512, may then include 100-1FF (in Hex.)) is located by space manager 544 for storage of the new information. This free location is shown to be PBA '10' (in Hexadecimal notation, or 16 in decimal notation). In row 718, where the entries for LBA '10' will remain the same as shown in FIG. 11 except the used flag in location 742 will be set (in the preferred embodiment, a flag is set when it is at logic state '1' although the opposite polarity may be used without deviating from the present invention) to indicate that the PBA '10' is now "in use".

The entries in row 716 are modified to show '10' in MVPBA block address location 732, which provides the PBA address of the moved portion for the LBA '00' block. The move flag in location 734 is set to logic state '1' to indicate that at least a portion (one or more sectors) of the LBA '00' block have been moved to a PBA location other than the PBA location indicated in location 730 of table 700. Finally, the bits of the move status location 714 in row 716 are set to '1000000000000000' (in binary notation, or '8000' in hexadecimal notation), reflecting the status of the moved sectors within the block LBA '00'. That is, in this example, '8000' indicates that the first sector, or sector '0', within LBA '00' block has been moved to a different PBA location.

Referring now to FIG. 20, the state of table 700 in FIG. 12 will affect the contents of the flash memory device 510 in that the moved sector of the LBA '0' block will now be written to PBA '10' in row 780. Row 780 will then include the data for the moved sector, which is 512 bytes in size. With respect to the moved sector information, row 780 further includes ECC code, a copy of the values in flag locations 734–740 of table 700 (in FIG. 12), and LBA '00' for indicating that the data in row 780 belongs to LBA '00' and may further include the move status for each of the individual sectors within the LBA '0' block.

While not specifically shown in the figure, the move flag within location 756 of PBA row 750 is set to indicate that at least a portion of the corresponding block has been moved. The value stored in the move status location 714 of row 716 (in FIG. 12), which is '8000' in Hex., is also stored within location 760 of the row 750. As earlier noted, this indicates that only sector '0' of PBA '0' was marked "moved" and the new block LBA '0' was written to PBA '10' in flash memory. Without further detailed discussions of FIG. 22, it should be appreciated that the examples to follow likewise affect the contents of the flash memory device 510.

FIG. 13 shows the status of table 700 when yet another write operation to LBA '00' is performed. The values (or entries) in row 716 remain the same as in FIG. 12 except that the value in location 732 is changed to '20' (in Hex. Notation) to indicate that the moved portion of block LBA '00' is now located in PBA location '20' (rather than '10' in FIG. 12). As in FIG. 12, the value in move status location 714, '8000', indicates that the first sector (with PBA '00') is the portion of the block that has been moved.

Row 718 is modified to show that the LBA '10' block is now old and can no longer be used before it is erased. This is indicated by the value in location 744 being set to logic state '1'. The entries for LBA '20', row 720, remain unchanged except that location 746 is modified to be set to logic state '1' for reflecting the state of the PBA '20' block as being in use. It is understood that as in FIGS. 11 and 12, all remaining values in table 700 of FIG. 13 that have not been discussed above and are not shown as having a particular logic state in FIG. 13 are all unchanged (the flags are all set to logic state '0').

Figure 15:
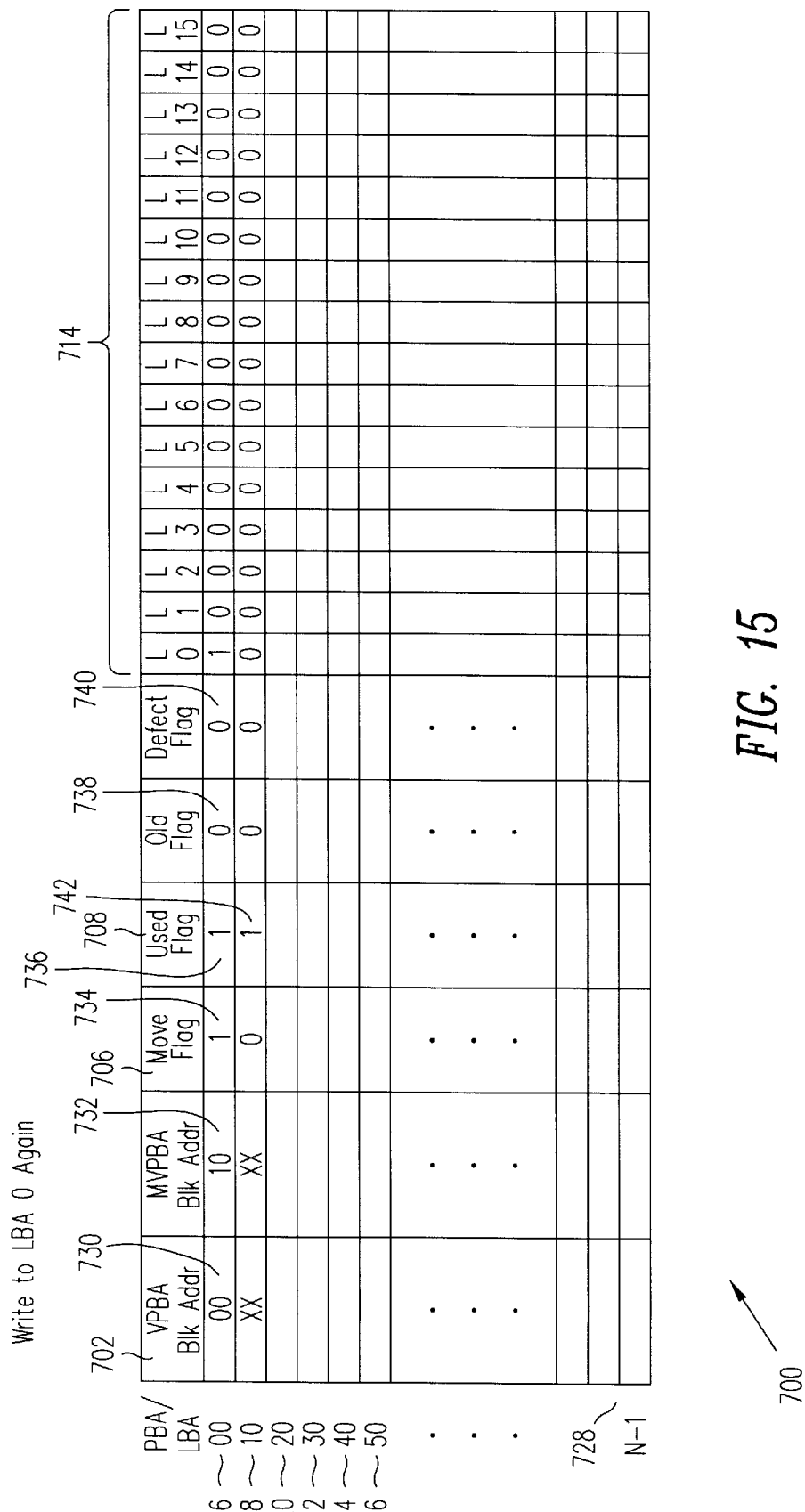

FIGS. 14–16 show yet another example of what the state of table 700 may be after either power-up or erasure of the blocks with the memory unit 508. In FIGS. 14 and 15, the same write operations as those discussed with reference to FIGS. 11 and 12 are performed. The state of table 700 in FIGS. 16 and 17 resembles that of FIGS. 11 and 12, respectively (the latter two figures have been re-drawn as FIGS. 14 and 15 for the sole convenience of the reader). Briefly, FIG. 14 shows the state of table 700 after a write to LBA '0' and FIG. 15 shows the state of table 700 after another write to LBA '0'.

FIG. 16 picks up after FIG. 15 and shows the state of table 700 after the host writes to LBA '5'. As indicated in FIG. 16, LBA '5' has been moved to PBA '10' where LBA '0' is also located. To this end, MBPBA block address location 732 is set to '10' in row 716 and the move flag is set at location 734 in the same row. Moreover, the state of move status location 714 in row 716 is set to '8400' (in Hex.) indicating that LBA '0' and LBA '5' have been moved, or that the first and fifth sectors within LBA '00' are moved. Being that these two sectors are now located in the PBA '10' location of the flash memory device 510, the move flag for each of the these sectors are also set in the flash memory device 510. It should be understood that LBA '5' was moved to PBA '10' because remaining free sectors were available in that block. Namely, even with LBA '0' of that block having been used, 15 other sectors of the same block were available, from which the fifth sector is now in use after the write to LBA '5'.

Figure 17:
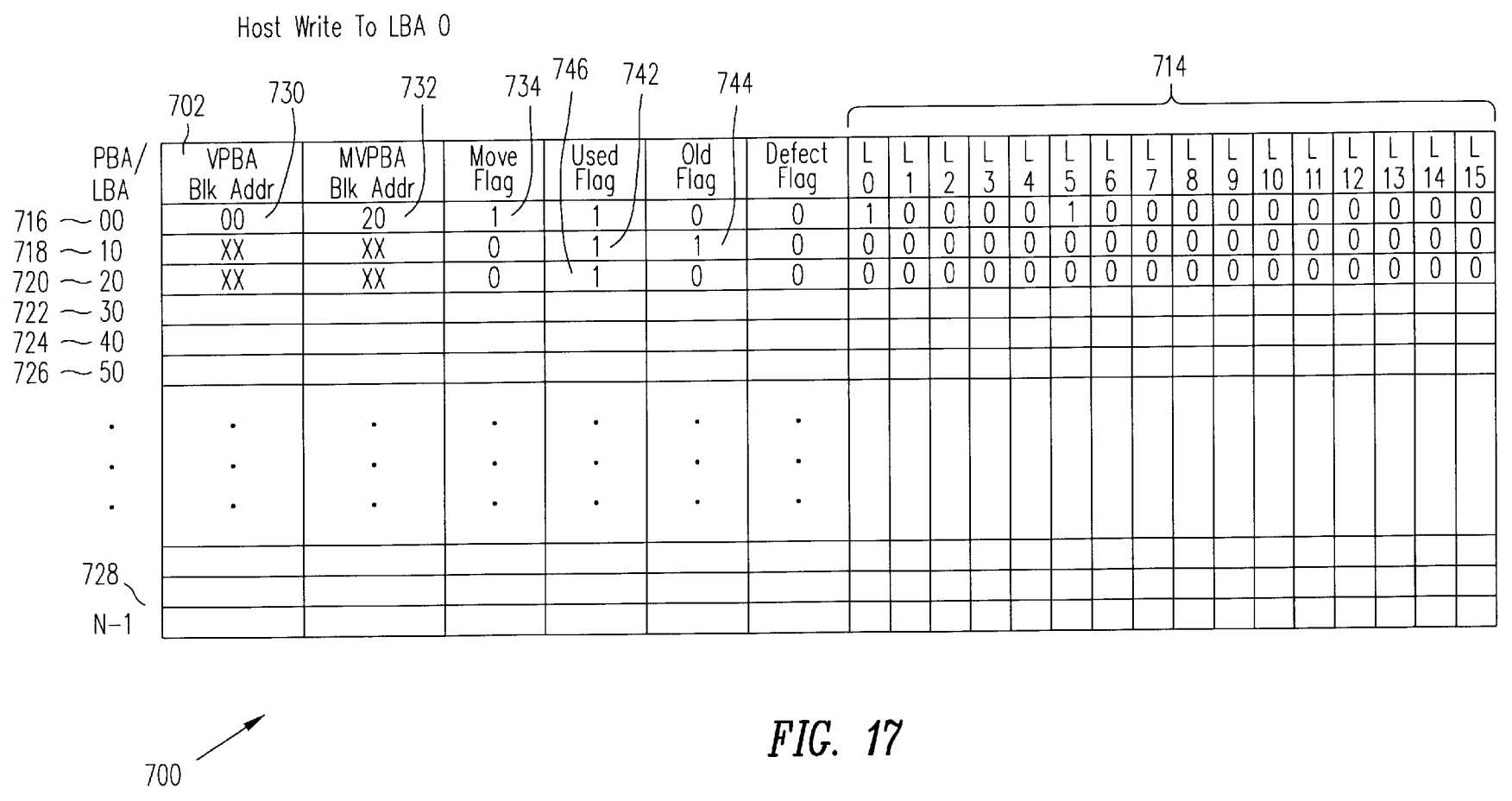

Continuing on with the example of FIG. 16, in FIG. 17, the state of the table 700 is shown after the host writes yet another time to LBA '0'. According to the table, yet another free PBA location, '20', is found where both the LBA '5' and LBA '0' are moved. First, LBA '5' is moved to the location PBA '10' to PBA '20' and then the new block of location LBA '0' is written to PBA '20'. As earlier discussed, any time there is a move of a block (for example, here the block of LBA '5' is moved) it is first moved from the location within flash memory where it currently resides to a temporary location within the controller 506, namely with the buffer RAM block 522, and then it is transferred from there to the new location within the flash memory devices.

The used flag in location 746 of row 720 is set to reflect the use of the PBA '20' location in flash memory and the old flag in location 744 is set to discard use of PBA '10' location until it is erased. Again, in flash memory, the state of these flags as well as the state of the move flag for both the LBA '0' and LBA '5' sectors are replicated.

FIG. 18 picks up from the state of the table 700 shown in FIG. 16 and shows yet another state of what the table 700 may be after the host writes to LBA '5'. In this case, the block of LBA '0' is first moved from location PBA '10' within the flash memory device 510 wherein it is currently stored to location PBA '20' of the flash memory. Thereafter, the new block being written to LBA '5' by the host is written into location PBA '20' of the flash memory. The flags in both table 700 and corresponding locations of the flash memory device 510 are accordingly set to reflect these updated locations.

FIG. 19 also picks up from the state of the table 700 shown in FIG. 16 and shows the state of what the table 700 may be after the host writes to LBA '7'. In this case, the new block is simply written to location PBA '10' of the flash memory since that location has not yet been used. Additionally, three of the bits of the move status location 714 in row 716 are set to show that LBA '0', LBA '5' and LBA '7' have been moved to another PBA location within the flash memory. Location 732 shows that the location in which these three blocks are stored is PBA '10'.

As may be understood from the discussion presented thus far, at some point in time, the number of sectors being moved within a block makes for an inefficient operation. Thus, the need arises for the user to set a threshold for the number of sectors within a block that may be moved before the block is declared "old" (the old flag is set) and the block is no longer used, until it is erased. This threshold may be set at, for example, half of the number of sectors within a block. This is demonstrated as follows: For a block having 16 sectors, when 8 of the sectors are moved into another block, the "original" block and the "moved" block (the block in which the moved sectors reside) are combined into the same PBA block. The combined PBA block may be stored in a new block altogether or, alternatively, the "original" block may be combined with and moved into the "moved" block. In the latter case, the "original" block is then marked as "old" for erasure thereof. If the combined PBA block is stored in a new block, both of the "original" and the "moved" blocks are marked as "old".

Figure 21:
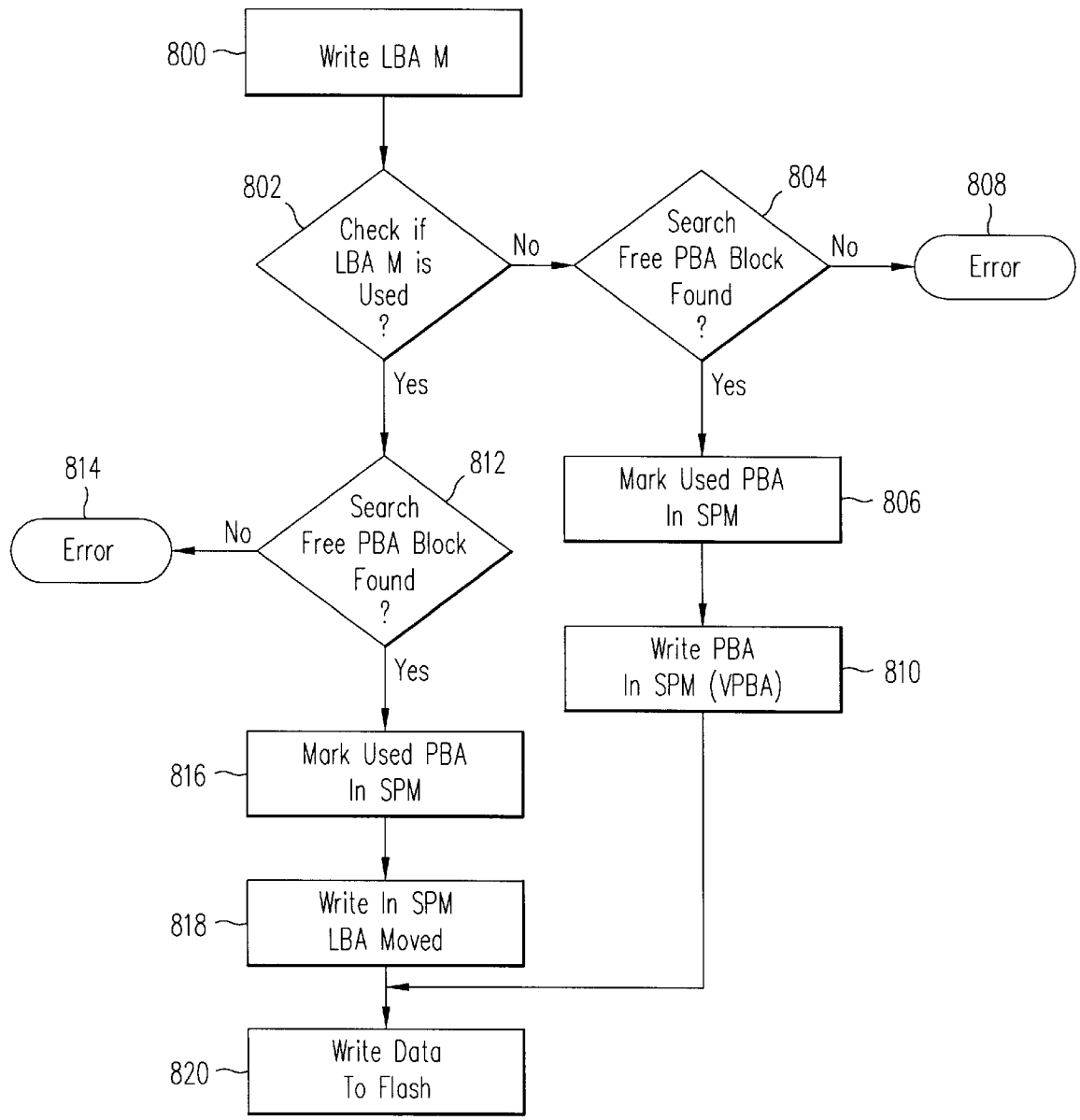
FIG. 21 shows a high-level flow chart of the general steps employed in writing a block of information to the nonvolatile devices of FIG. 10.

FIG. 21 depicts a general flow chart outlining some of the steps performed during a write operation. It is intended to show the sequence of some of the events that take place during such an operation and is not at all an inclusive presentation of the method or apparatus used in the preferred embodiment of the present invention.

The steps as outlined in FIG. 21 are performed under the direction of the microprocessor block 524 as it executes program code (or firmware) during the operation of the system.

When the host writes to a block of LBA M, step 800, the space manager block 544, in step 802, checks as to whether LBA M is in use by checking the state of the corresponding used flag in table 700 of the SPM RAM block 548. If not in use, in step 804, a search is performed for the next free PBA block in memory unit 508. If no free blocks are located, an "error" state is detected in 808. But where a free PBA is located, in step 806, its used flag is marked (or set) in table 700 as well as in flash memory. In step 810, the PBA of the free block is written into the VPBA block address 702 location of the corresponding LBA row in table 700.

Going back to step 802, if the LBA M block is in use, search for the next free PBA block is still conducted in step 812 and upon the finding of no such free block, at 814, an "error" condition is declared. Whereas, if a free PBA location is found, that PBA is marked as used in table 700 and flash memory, at step 816. Next, in step 818, the state of the block is indicated as having been moved by setting the move flag as well as the setting the appropriate bit in the move status location 714 of table 700. The new location of where the block is moved is also indicated in table 700 in accordance with the discussion above.

Finally, after steps 818 and 810, data and all corresponding status information, ECC code and LBA are written into the PBA location within the flash memory.

As earlier indicated, when a substantial portion of a block has sectors that have been moved (in the preferred embodiment, this is eight of the sixteen sectors), the block is declared "old" by setting its corresponding "old" flag. Periodically, blocks with their "old" flags set, are erased and may then be re-used (or re-programmed, or re-written).

As can be appreciated, an advantage of the embodiments of FIGS. 10–21 is that a block need not be erased each time after it is accessed by the host because if for example, any portions (or sectors) of the block are being re-written, rather than erasing the block in the flash memory devices or moving the entire block to a free area within the flash, only the portions that are being re-written need be transferred elsewhere in flash, i.e. free location identified by MVPA block address. In this connection, an erase cycle, which is time consuming is avoided until later and time is not wasted in reading an entire block and transferring the same.

In an alternative embodiment, there may be less information pertaining to each sector that is stored in the flash memory. Likewise, the table 700 in the SPM RAM block 548 (in FIG. 10) maintains less information such as explained below.

FIG. 22 shows an example of the information a flash memory chip (such as flash memory device 510) may store. In FIG. 22 is shown, N blocks, blocks 1000, 1002, . . . , 1004, with each block having up to m sectors Using block 1000 as an example, each of the sectors 1006, 1008, . . . , 1010 within block 1000 includes a data field 1052 and an ECC field 1014. In the preferred embodiment, the data field 1052 contains 512 bytes and the ECC field 1014 contains 4 bytes of information although other sizes of both data and ECC may be employed without departing from the spirit of the present invention.

The first sector in each block, for example sector 1006 of block 1000, additionally includes a defect flag 1016 indicating whether the block is defective or not. In the preferred embodiment, if any of the sectors within a block are defective, the entire block is marked defective as further explained below.

Each sector within a block may further contain a spare area 1018. In each block, there is included an LBA 1020 for identifying the block within the flash memory unit, as will be explained in greater detail shortly. It is however, important to note that the LEA 1020 while shown in FIG. 22 to be located within the last sector 1010 of block 1000, may be alternatively located within any other sector of block 1000 and further within any area within the sector in which it is located. For example, LBA 1020 may be located within the spare area 1022 of sector 1008 or it may be located at 1024, which is right before the location where data is stored for the sector 1008 of block 1000. The same sector organization that is used for block 1000 is also used for the remaining blocks such as blocks 1002 and 1004 within the flash memory devices.

Similarly, the location of the defect flag 1012 may be anywhere within the block. For example, the defect flag 1012 may be alternatively stored at 1024 or at 1022. But there is only one defect flag stored per block. An aspect of the present invention relates to the way in which the defect flag is employed.

During manufacturing of flash memory chips, defects within the memory are commonly identified and marked by the chip manufacturer. This is typically done by writing a predefined pattern (byte-wide) in a predetermined location within a defective block. That is, the manufacturer will erase the flash chip and a value, such as all '1''s, will then be carried by each memory cell within the flash chip that was successfully erased. If a sector or a cell within a block is defective, the manufacturer will set a manufacturing defect flag located somewhere within the defective block (not shown in FIG. 22) to a predetermined value. This manufacturing defect flag is not the same as defect flag 1012 and its location is determined by the manufacturer and not by design choice. These manufacturer-identified defective blocks are then ignored (or not used) during system operation. That is, the space manager block 544 (in FIG. 10) keeps track of these defective blocks and knows not to use them when it searches for a free block within the flash memory devices.

Other than defects detected during manufacturing of flash chips, there may be additional defects developed during operation of the chips due to wearing as discussed earlier. These defects are sometimes referred to as "grown defects" by the industry at-large and must be accounted for by a system in which using flash memory devices are employed.

The case of "grown defects" will be explained in the context of system operations. In a preferred embodiment of the present invention, after erasure of the block 1000, the defect flag 1012 (in FIG. 22) is programmed to indicate whether the erased block is defective or not. That is, if the cells in the erased block 1000 were successfully erased, the defect flag 1012 is set to a predefined value such as a byte-wide value of '55' (in Hex.) indicating that the block is not defective. If on the other hand, the block is not successfully erased, a value other than '55', such as '00', is written to the defect flag 1012 or alternatively, no value is written and whatever the state of the defect flag was after erasure (commonly, an erased state is all '1''s (or 'FF' in Hex.)) will be maintained. In the latter case however, the erased state of the defect flag must be a value other than '55' in order to distinguish successful erasures.

The use of the defect flag 1012 is especially noted after power-up of the system. The space manager block 544 takes note of which blocks are defective by quickly scanning the defect flags of each block and identifying those blocks that are not defective for later by searching for the value '55' in the defect flag 1012 of each block. If a block is not defective after power-up and later becomes defective, its defect flag is modified to so designate and the next time the system is powered-up, the defective block is noted by the space manager and any use of the block is avoided.

During a write operation, if a failure of one or more cells of a block occurs, the block is first erased and then marked as being defective by writing a value other than '55' (such as '00') to the defect flag 1012 of the defective block. Alternatively, there is no value written to the defect flag 1012 of the defective block.

One of the advantages of having a defect flag such as described thus far is that during system power-up, the space manager block 544 (in FIG. 10) is able to quickly find blocks that are not defective.

Figure 23:
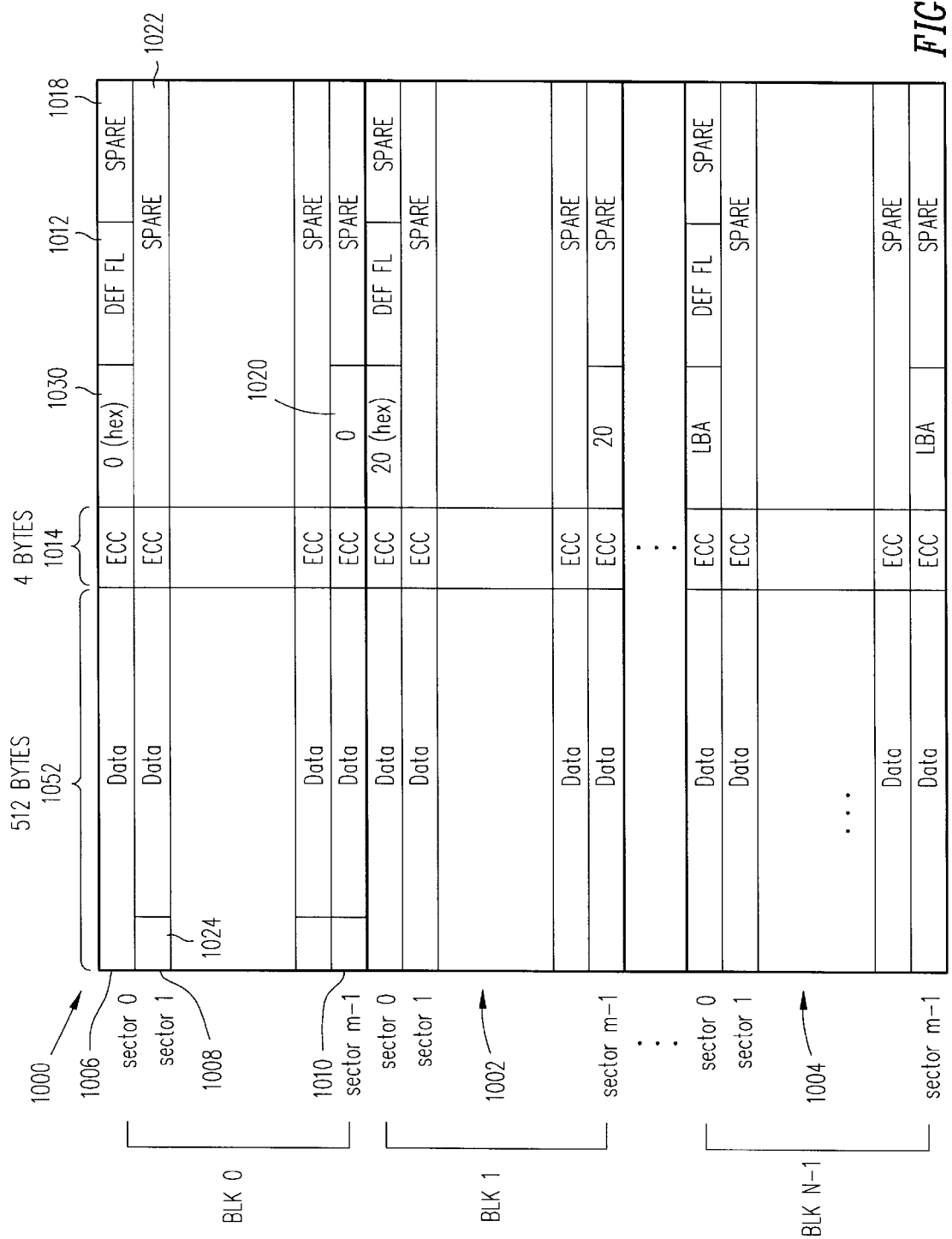
FIG. 23 is an example of the contents of flash memory devices wherein another alternative embodiment of the present invention stores the LBA address for each block in two different sector locations within the block.

In an alternative embodiment, as shown in FIG. 23, the LBA for each block within the flash memory devices is stored within two different sectors of the same block. For example, after block 1000 has been erased and during the first write operation of block 1000 following its erasure, the space manager block 544 determines that block 1000 or a portion thereof is free to be written into. The LBA associated with block 1000 is then programmed into two locations 1030 and 1020 (within sectors 1006 and 1010, respectively) of block 1000.

Thereafter, each time power to the system is temporarily interrupted, or upon power-up, the two LBAs in locations 1030 and 1020 are compared to each other and if they match and the defect flag 1012 indicates that the block is not defective, the block continues to be used for information storage under the direction of the space manager block 544. If however, the defect flag 1012 indicates that the block is not defective but the two LBAs do not match, then the block 1000 will still continue to be used but it will first be erased prior to further re-use. The latter case may arise, for example, when the system was writing to block 1000 and the first several sectors starting with sector 0 were written but then there was a power interruption and information was therefore not written to the remaining sectors of block 1000. In this case, the LBA values in locations 1030 and 1020 will likely not match because sector m−1, or sector 1010, of block 1000 was not written into prior to the power interruption. Upon power restoration, since not completely written, the block 1000 should not be used in its state as it was prior to the power interruption. Accordingly, upon detecting a mismatch between the two LBA values in locations 1030 and 1020, the controller 506 (in FIG. 10) will erase the block 1000 prior to its re-use.

Where only one LBA is used per block, as shown in FIG. 22, obviously, the comparison of two LBAs in each block is not performed yet detection of blocks that are defective is maintained through the use of the defect flag as explained earlier. Additionally, the LBA may be written last, that is, after all of the sectors of the block are written. Writing the LBA last is an added measure of successfully having written to the block.

Figure 24A:
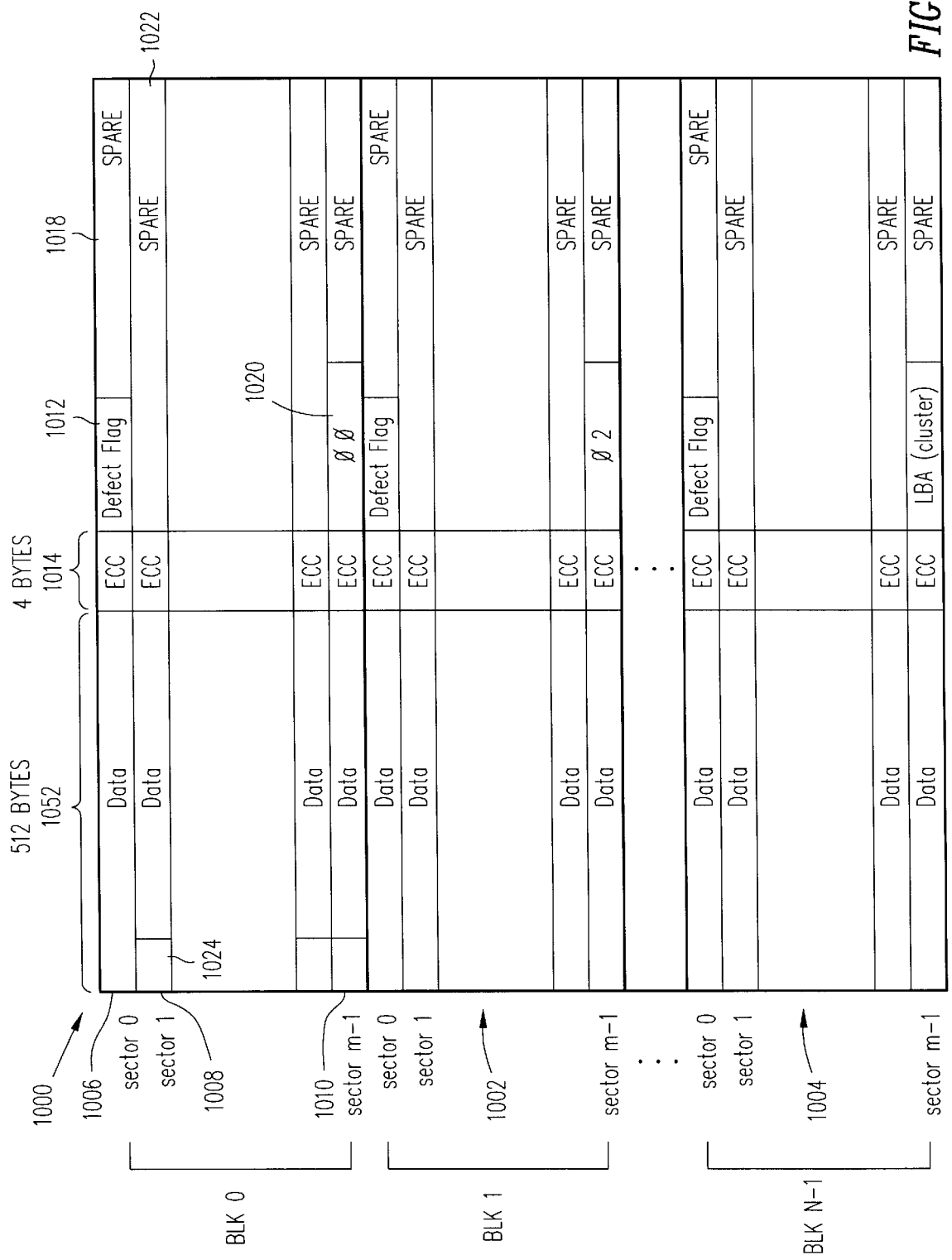
FIG. 24 shows an example of yet another alternative embodiment of the present invention wherein the contents of the flash memory devices and the SPM RAM block are depicted to illustrate the correlation between the LBA and PBA addressing as employed by the system of FIG. 10.

To illustrate another aspect of the present invention, FIG. 24 shows, on the left-hand side, an example of the contents of several blocks of the flash memory device (this is the same information that is illustrated in FIG. 22) and, on the right-hand side, an example of the contents of the table 700, which corresponds to the block information that is on the left-hand side of the figure. The purpose of showing the block contents is only to serve as convenience to the reader in understanding the correlation between the LBA-PBA addressing of the blocks with respect to the table 700. The example shown in FIG. 24 is to illustrate the mapping of this alternative embodiment between the addresses of the blocks as they are stored in flash memory and the addresses of the same blocks as that information is stored in the SPM RAM block 548.

In the table 700, there is shown to be stored in a column, a virtual PBA field 1036 and a flag field 1038 including a defect flag 1012 for each row. Rows 1040, 1042, 1044, 1050 each correspond to an LBA and are addressed by '0', '1', '2', , 'Z' respectively. The virtual PBA field 1036 for each row actually contains an LBA address pointer that points to a block within the flash memory having 16 sectors stored therein. In this respect, the virtual PBA serves as the PBA for 16 sectors (the number of sectors may be other than sixteen in alternative embodiments).

If the host sends a command to read for example, LBA 05, the controller 506, in FIG. 10, first masks the four least significant bits (LSBs) of the value '05' to obtain the value '00'. Then using '00' as the row address for table 700, the row 1040 in FIG. 24 is addressed. Note that the reason the four LSBs of the LBA value sent by the host is masked is because there are 16 sectors being represented by each row of table 700. 16 sectors is two to the power of 4 in binary terms which translates to 4 bits. If for example each row represented 32 sectors, then the 5 LSBs of the LBA sent by the host would be masked.

Once the row 1040 in the SPM RAM block 548 has been addressed, the value in the virtual PBA field 1036 for the row 1040 is retrieved, which in this case is '00'. '00' is then used as the pointer to the blocks stored within the flash memory devices. That is, in this example, block 0, or the block 1000 (on the left-hand side of FIG. 24) is addressed. But to get to the sector that was intended to be read, the 4 bits that were initially masked from the LBA value sent by the host, are used to specifically address sector '5' (not shown), which is the sixth sector, within the block 1040. The data stored in the data field 1052 of sector 5 (not shown) is then retrieved or read. Next, the ECC field 1014 of that same sector is read.

The LBA location 1020 should have the value '00', which is the same address value that is stored in the virtual PBA field 1036 of the row 1040 of table 700. This is intended for identifying the block 1000 in the flash memory devices as block '00' during the power-up routine, to update the space manager. Although, the LBA location 1020 does not represent the LBA value sent by the host as noted above. To avoid such confusion, the value in location 1020 may be referred to as a 'cluster' address rather than an LBA address.

To illustrate another example in the context of a write operation, if the host commands the controller 506 to write to LBA '17' (in decimal notation), the controller masks the LSBs of the hexadecimal notation of '17' (which is '11'). The masked version of '17' is '1' in hexadecimal notation. Thus, the row 1042 is addressed in table 700 and a the address of a free block, as found by the space manager block 544, is placed in the virtual PBA field 1036 of the row 1042. In this case, block 2 is found as the next free block. Within the flash memory devices, block 2, which is the block 1002, is addressed. The sector where information is actually written into is sector 1 of the block 1002 (the second sector in that block) because the 4 LSBs of the LBA value '11' sent by host. The data and ECC are then written into the sector 1 of block 1002.

If the preferred embodiment example of FIG. 24 is used with the embodiment discussed with reference to FIG. 23, the LBA (or cluster) address is written in two places within each of the blocks.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A storage device having nonvolatile memory and being coupled to a host for storing information, organized in blocks, in the nonvolatile memory, each block having associated therewith a logical block address (LBA) and a physical block address (PBA), the LBA provided by the host to the storage device for identifying a block to be accessed, the PBA developed by the storage device for identifying a free location within the nonvolatile memory wherein the accessed block is to be stored, each stored block within the nonvolatile being selectively erasable and further having one or more sectors, the storage device comprising:

a. a memory device for storing a table defined by n LBA rows, each of the LBA rows being uniquely addressable by an LBA and for storing a virtual PBA for identifying the location of the stored block, a move virtual PBA for identifying the location of a portion of the stored block, and status information including flag means for indicating whether any sectors of the stored block have been moved to the move virtual PBA location within the nonvolatile memory;

b. means for receiving from the host, a block of information identified by a particular LBA to be stored in the nonvolatile memory, for developing the virtual PBA if the particular LBA is "unused" and for developing the move virtual PBA if the particular LBA is "used";

c. defect flag stored within each of the blocks and being set to a predetermined value for identifying successfully erased blocks, wherein portions of a block may be stored in more than one PBA-identified location within the nonvolatile memory to avoid an erase operation each time the host writes to the storage device and to avoid transfer of the entire block to a free location within the nonvolatile memory each time a portion of the block is being re-written.

* * * * *

UNITED STATES PATENT AND TRADEMARK OFFICE
CERTIFICATE OF CORRECTION

PATENT NO. : 5,838,614

DATED : November 17, 1998               Page 1 of 2

INVENTOR(S) : Petro Estakhri, et al

It is certified that error appears in the above-identified patent and that said Letters Patent is hereby corrected as shown below:

On the Title Page, Item [75] Inventors, should read: --- Berhanu Iman ---

In column 1, at line 11, delete "my"

In column 3, at line 44, delete "solutions" and replace with --solution--

In column 6, at line 53, delete "of"

In column 6, at line 66, delete "arc" and replace with --are--

In column 7, at line 9, delete "updates" and replace with --update--

In column 7, at line 23, delete "and to" and replace with --via--

In column 7, at line 26, delete "1.00" and replace with --100--

In column 8, at line 29, after "addresses" insert --is--

In column 8, at line 44, delete "prevent" and replace with --prevents--

In column 9, at line 3, after "busses and" insert --include--

In column 10, at line 18, delete "method" and replace with --methods--

UNITED STATES PATENT AND TRADEMARK OFFICE
CERTIFICATE OF CORRECTION

PATENT NO. : 5,838,614

DATED : November 17, 1998

INVENTOR(S) : Petro Estakhri, et al

It is certified that error appears in the above-identified patent and that said Letters Patent is hereby corrected as shown below:

```
     In column 11, at line 25, after "32 sectors" delete "."

In column 18, at line 39, delete "LEA" and replace with
--LBA--

In column 21, at line 21, after "and" delete "a"

In column 22, at line 13, after "nonvolatile" insert
--memory--
```

Signed and Sealed this

Third Day of April, 2001

Attest:

NICHOLAS P. GODICI

Attesting Officer     Acting Director of the United States Patent and Trademark Office